(12) United States Patent
Lee et al.

(10) Patent No.: US 12,255,090 B1
(45) Date of Patent: Mar. 18, 2025

(54) APPARATUS FOR TRANSFERRING SUBSTRATE IN VACUUM CHAMBER

(71) Applicant: T-Robotics Co., Ltd., Osan-si (KR)

(72) Inventors: Soo Jong Lee, Suwon-si (KR); Chang Seong Lee, Hwaseong-si (KR); Chang Hyun Jee, Anyang-si (KR); Sang Hwi Ham, Seoul (KR)

(73) Assignee: T-Robotics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/925,750

(22) Filed: Oct. 24, 2024

(30) Foreign Application Priority Data

Aug. 16, 2024 (KR) .......................... 10-2024-0110032

(51) Int. Cl.
| | | |
|---|---|---|
| *H01L 21/687* | (2006.01) | |
| *B25J 9/04* | (2006.01) | |
| *H01L 21/67* | (2006.01) | |
| *H01L 21/677* | (2006.01) | |

(52) U.S. Cl.
CPC ........ *H01L 21/68707* (2013.01); *B25J 9/044* (2013.01); *H01L 21/67167* (2013.01); *H01L 21/67742* (2013.01)

(58) Field of Classification Search
None
See application file for complete search history.

(56) References Cited

U.S. PATENT DOCUMENTS

| | | | | |
|---|---|---|---|---|
| 8,434,992 | B2 * | 5/2013 | Tara | B25J 9/044 414/941 |
| 10,780,586 | B2 * | 9/2020 | Kitahara | H01L 21/68707 |
| 2005/0217053 | A1 | 10/2005 | Kim et al. | |

FOREIGN PATENT DOCUMENTS

KR 1020050061925 A 6/2005

OTHER PUBLICATIONS

Claims Granted in Application No. 10-2024-0110032, issued Nov. 1, 2024 by the Korean Intellectual Property Office, 11 pages.
First Office Action, mailed Oct. 10, 2024 by the Korean Intellectual Property Office, in Application No. 10-2024-0110032, 4 pages.

(Continued)

*Primary Examiner* — Michael S Lowe
(74) *Attorney, Agent, or Firm* — Thompson Patent Law Offices PC

(57) ABSTRACT

A substrate transfer apparatus that transfers a substrate in a vacuum chamber is provided. The substrate transfer apparatus includes: an elevating robot, a travel robot, and a substrate transfer robot. The travel robot includes: (i) a travel arm, through which a b1-st vertical through-hole and a b2-nd vertical through-hole are formed, wherein an internal slot is formed at inner area of the travel arm than where the b2-nd vertical through-hole is located, wherein the internal slot is separated from the b2-nd vertical through-hole with a partition, wherein a bottom-open-type space that connects the b2-nd vertical through-hole with the internal slot is formed in the travel arm, and wherein an internal wiring hole that connects the b1-st vertical through-hole with the internal slot is formed in the travel arm, (ii) a b-th driving motor installed in the internal slot, and (iii) a b-th speed reducer installed in the b2-nd vertical through-hole.

11 Claims, 19 Drawing Sheets

(56) References Cited

OTHER PUBLICATIONS

Notice of Allowance, mailed Nov. 1, 2024 by the Korean Intellectual Property Office in Application No. 10-2024-0110032, 2 pages.
Statement dated Nov. 7, 2024, by Dong Joon Jung, that the English Translations of Allowed Claims and Office Actions for the Korean Application No. 10-2024-0110032 are Accurate, 1 page.

* cited by examiner

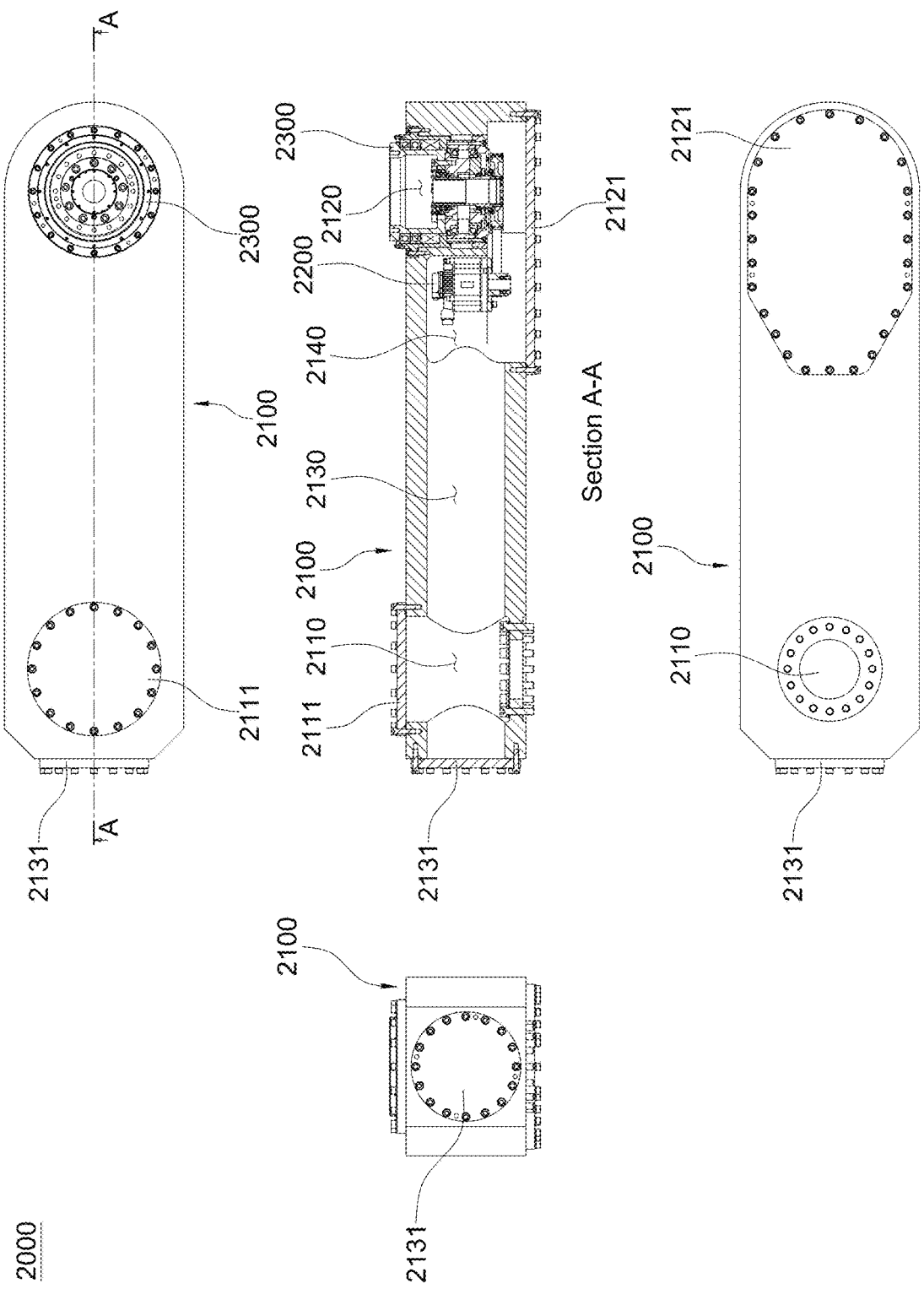

APPARATUS FOR TRANSFERRING SUBSTRATE IN VACUUM CHAMBER

CROSS REFERENCE TO RELATED APPLICATION

This application claims the benefit of priority to Korean Patent Application No. 10-2024-0110032, filed on Aug. 16, 2024, the entire contents of which being incorporated herein by reference.

FIELD OF THE DISCLOSURE

The present disclosure relates to a substrate transfer apparatus; and more particularly, to the substrate transfer apparatus that allows long-distance transfer of high-load substrates within a vacuum chamber.

BACKGROUND OF THE DISCLOSURE

In general, a substrate such as a wafer for a semiconductor device, a glass substrate for a display device, or a glass substrate for a thin film solar cell is manufactured by performing various processes on the substrate. During these processes, the substrate is loaded and processed in a substrate processing apparatus that provides optimal conditions required for each of the processes. Additionally, masks are used as substrates to form various patterns.

Nowadays, in order to improve productivity for the substrate, a cluster-type substrate processing apparatus capable of collectively processing the substrate is being developed and used.

The cluster-type substrate processing apparatus includes a load lock chamber for loading or unloading the substrate, a transfer chamber for transferring the substrate, and a plurality of process chambers for performing each manufacturing process.

Additionally, a substrate transfer robot, installed in the transfer chamber that is in a vacuum state, may transfer the substrate back and forth between the transfer chamber and the load lock chamber, among multiple transfer chambers, or in and out of the process chambers.

Recently, in order to cope with a large size of the substrate and to improve a substrate processing capability, various researches are in progress to establish a structure capable of processing two substrates in one process chamber or to change an octagonal structure in which four process chambers are installed at equal distances around the transfer chamber to a tetragonal structure having the processing chambers installed on both sides of a transfer path of the transfer chamber.

Especially, in order to deal with an offset distance between respective locations of the two substrates in a structure where they are positioned within one process chamber or in order to account for install locations of each of the process chambers in the tetragonal structure, moving a position of the substrate transfer robot is inevitably required.

To this end, recently, after a travel robot is installed inside a vacuum chamber and then a transfer robot is installed on the travel robot, the travel robot is driven to move the transfer robot to a set position inside the vacuum chamber, and the transfer robot is then driven to transfer the substrate.

However, a travel robot included in a conventional substrate transfer apparatus like above is configured as a complex structure in order to move the transfer robot within a vacuum chamber, and since an additional structure for the travel robot must be installed in an internal space of the vacuum chamber, the vacuum chamber should be made with sufficient room in a height direction.

Therefore, the conventional substrate transfer apparatus has a disadvantage in that it costs a lot to manufacture the travel robot.

In addition, as the travel robot is installed, the height from the bottom of the vacuum chamber to the top of the substrate transfer apparatus should be increased, and accordingly, a volume of the vacuum chamber itself in which the substrate transfer apparatus is installed should also be increased. Therefore, a manufacturing cost of the whole facility as mentioned above is increased.

Accordingly, as the volume of the vacuum chamber itself increases, an operating cost for maintaining a vacuum state of the vacuum chamber also increases.

Therefore, the present disclosure proposes a method for configuring the travel robot included in the substrate transfer apparatus with a simple structure.

SUMMARY OF THE DISCLOSURE

It is an object of the present disclosure to solve all the aforementioned problems.

It is another object of the present disclosure to provide a more compact substrate transfer apparatus with an improved efficiency related to an installation area and an installation height.

It is still another object of the present disclosure to provide the substrate transfer apparatus with a simple structure capable of minimizing vibration and/or disturbance and minimizing a change in posture due to a thermal expansion.

It is still yet another object of the present disclosure to provide the substrate transfer apparatus with a vacuum-sealed structure that completely blocks a generation of particles in a vacuum chamber.

It is still yet another object of the present disclosure to provide the substrate transfer apparatus that can reduce a manufacturing cost and an operating cost of the whole facility related to the substrate transfer apparatus.

The characteristic configurations of the present disclosure for achieving the object of the present disclosure as described above and realizing the characteristic effects of the present disclosure which will be described below are as follows.

In accordance with one aspect of the present disclosure, there is provided the substrate transfer apparatus that transfers a substrate in a vacuum chamber, comprising: an elevating robot including: a hollow elevating shaft through which an a-th hollow hole is formed, and an elevation driving unit that moves the hollow elevating shaft up-and-down and rotate s the hollow elevating shaft, wherein the elevating robot is sealably coupled with a vacuum chamber through-hole formed in a lower region of the vacuum chamber; a travel robot including: (i) a travel arm, through which a b1-st vertical through-hole is formed on an upper surface thereof and a lower surface thereof at a b-th one-end area thereof and through which a b2-nd vertical through-hole is formed on the upper surface thereof and the lower surface thereof at a b-th opposite-end area thereof, wherein the lower surface faces a ground, wherein an internal slot is formed at inner area of the travel arm than where the b2-nd vertical through-hole is located, wherein the internal slot is separated from the b2-nd vertical through-hole with a partition, wherein a bottom-open-type space that connects the b2-nd vertical through-hole with the internal slot is formed in the travel arm, wherein the bottom-open-type space has a predetermined depth from the lower surface toward the upper surface, and wherein an internal wiring hole that connects the b1-st vertical through-hole with the internal slot is formed in the travel arm, (ii) a b-th driving motor installed in the internal slot of the travel arm, and (iii) a b-th speed reducer installed in the b2-nd vertical through-hole of the travel arm, wherein the b-th speed reducer rotates in conjunction with the b-th driving motor, and wherein a rotation driving shaft thereof with a b-th hollow hole is exposed on the upper surface; wherein the hollow elevating shaft is sealably coupled such that the b1-st vertical through-hole is matched with the a-th hollow hole of the hollow elevating shaft at a first specific lower surface area of the lower surface corresponding to the b1-st vertical through-hole of the b-th one-end area, wherein a b1-st cover is sealably coupled at a first specific upper surface area of the upper surface corresponding to the b1-st vertical through-hole of the b-th one-end area, and wherein a b2-nd cover is sealably coupled at a second specific lower surface area of the lower surface corresponding to the bottom-open-type space of the b-th opposite-end area; and a substrate transfer robot including: (i) a transfer arm platform including (i-1) a c1-st coupling hole, formed at a c-th center area which is a specific area on a center line corresponding to a linear movement direction of the substrate for transfer, wherein a c1-st stopping member, through which a c1-st vertical through-hole corresponding to the b-th hollow hole of the rotation driving shaft of the b-th speed reducer of the travel robot is formed, compartmentalizes the c1-st coupling hole into a c1-st upper space and a c1-st lower space, wherein the c1-st upper space is sealed by a c1-st cover, (i-2) a c2-nd coupling hole, formed at a c-th one-side area which is a one-side area with respect to the center line, wherein a c2-nd stopping member, through which a c2-nd vertical through-hole is formed, compartmentalize the c2-nd coupling hole into a c2-nd upper space and a c2-nd lower space which is sealed by a c2-nd cover, (i-3) a c3-rd coupling hole, formed at a c-th opposite-side area corresponding to the c-th one-side area at an opposite-side area with respect to the center line, wherein a c3-rd stopping member, through which a c3-rd vertical through-hole is formed, compartmentalizes the c3-rd coupling hole into a c3-rd upper space and a c3-rd lower space which is sealed by a c3-rd cover, (i-4) a (1_1)-st blade and a (1_2)-nd blade formed respectively at a forward part and a backward part of the c2-nd coupling hole, (i–5) a (2_1)-st blade and a (2_2)-nd blade formed respectively at the forward part and the backward part of the c3-rd coupling hole; and wherein the rotation driving shaft of the b-th speed reducer of the travel robot inserted into the c1-st lower space is fixedly coupled with the c1-st stopping member; (ii) a first transfer arm part including a (1_1)-st transfer link arm, a (1_2)-nd transfer link arm, a first common link arm, a (1_1)-st subordinate link arm which is parallel to the (1_1)-st transfer link arm, a (1_2)-nd subordinate link arm which is parallel to the (1_1)-st transfer link arm, a (1_3)-rd subordinate link arm which is parallel to the (1_2)-nd transfer link arm, a (1_4)-th subordinate link arm which is parallel to the first common link arm, and a first end-effector, wherein a c1-st driving motor and a c1-st speed reducer, interlocked with the c1-st driving motor to reduce a rotational speed of the c1-st driving motor by half, are installed in a sealed inner space of the (1_1)-st transfer link arm, wherein a (c1_1)-st hollow driving shaft having a (c1_1)-st hollow hole interlocked with the c1-st speed reducer and a (c1_1)-st output shaft interlocked with the (c1_1)-st hollow driving shaft are sealably installed on a (c1_1)-st one-end area of the (1_1)-st transfer link arm, wherein a (c1_2)-nd hollow driving shaft having a (c1_2)-nd hollow hole interlocked with the c1-st driving motor and a (c1_2)-nd output shaft interlocked with the (c1_2)-nd hollow driving shaft are sealably installed on a (c1_1)-st opposite-end area of the (1_1)-st transfer link arm, wherein the (c1_1)-st output shaft of the (1_1)-st transfer link arm is fixedly coupled with a (2_1)-st linking member that is inserted into the c2-nd upper space of the transfer arm platform, wherein the (2_1)-st linking member is fixedly coupled with the c2-nd stopping member, wherein a (c1_2)-nd one-end area of the (1_2)-nd transfer link arm is fixedly coupled with the (c1-2)-nd output shaft of the (1_1)-st transfer link arm through a first fixed coupling shaft, wherein a c1-st center area of the first common link arm is rotatably coupled with the first fixed coupling shaft, wherein a (c1_4)-th one-end area of the (1_1)-st subordinate link arm is rotatably coupled with the (1_1)-st blade of the transfer arm platform and a (c1_4)-th opposite-end area of the (1_1)-st subordinate link arm is rotatably coupled with a (c1_3)-rd one-end area of the first common link arm, wherein a (c1_5)-th one-side area of the (1_2)-nd subordinate link arm is rotatably coupled with the (1_2)-nd blade of the transform arm platform and a (c1_5)-th opposite-end area of the (1_2)-nd subordinate link arm is rotatably coupled with a (c1_3)-rd opposite-end area of the first common link arm, wherein a (c1_6)-th one-end area of the (1_3)-rd subordinate link arm is rotatably coupled with a (c1_3)-rd opposite-end area of the first common link arm, wherein a (c1_7)-th one-end area of the (1_4)-th subordinate link arm is rotatably coupled with a (c1_6)-th opposite-end area of the (1_3)-nd subordinate link arm and a (c1_7)-th opposite-end area of the (1_4)-th subordinate link arm is rotatably coupled with a (c1_2)-nd opposite-end area of the (1_2)-nd transfer link arm, and wherein the first end-effector is fixed with the (c1_7)-th opposite-end area of the (1_4)-th subordinate link arm to thereby support the substrate; and (iii) a second transfer arm part including a (2_1)-st transfer link arm, a (2_2)-nd transfer link arm, a second common link arm, a (2_1)-st subordinate link arm which is parallel to the (2_1)-st transfer link arm, a (2_2)-nd subordinate link arm which is parallel to the (2_1)-st transfer link arm, a (2_3)-rd subordinate link arm parallel to the (2_2)-nd transfer link arm, a (2_4)-th subordinate link arm parallel to the second common link arm, and a second end-effector, wherein a c2-nd driving motor and a c2-nd speed reducer, interlocked with the c2-nd driving motor to reduce a rotational speed of the c2-nd driving motor by half, are installed in a sealed inner space of the (2_1)-st transfer link arm, wherein a (c2_1)-st hollow driving shaft having a (c2_1)-st hollow hole interlocked with the c2-nd speed reducer and a (c2_1)-st output shaft interlocked with the (c2_1)-st hollow driving shaft are sealably installed on a (c2_1)-st one-end area of the (2_1)-st transfer link arm, wherein a (c2_2)-nd hollow driving shaft having a (c2_2)-nd hollow hole interlocked with the c2-nd driving motor and a (c2_2)-nd output shaft interlocked with the (c2_2)-nd hollow driving shaft are sealably installed on a (c2_1)-st opposite-end area of the (2_1)-st transfer link arm, wherein the (c2_1)-st output shaft of the (2_1)-st transfer link arm is fixedly coupled with a (2_2)-nd linking member that is inserted into the c3-rd upper space of the transfer arm platform, wherein the (2_2)-nd linking member is fixedly coupled with the c3-rd stopping member, wherein a (c2_2)-nd one-end area of the (2_2)-nd transfer link arm is fixedly coupled with the (c2_2)-nd output shaft of the (2_1)-st transfer link arm through a second fixed coupling shaft, wherein a c2-nd center area of the second common link arm is rotatably coupled with the second fixed coupling shaft, wherein a (c2_4)-th one-end area of the (2_1)-st subordinate link arm is rotatably coupled with the (2_1)-st blade of the transfer arm platform and a (c2_4)-th opposite-end area of the (2_1)-st subordinate link arm is rotatably coupled with a (c2_3)-rd one-end area of the second common link arm, wherein a (c2_5)-th one-side area of the (2_2)-nd subordinate link arm is rotatably coupled with the (2_2)-nd blade of the transfer arm platform and a (c2_5)-th opposite-end area of the (2_2)-nd subordinate link arm is rotatably coupled with a (c2_3)-rd opposite-end area of the second common link arm, wherein a (c2_6)-th one-end area of the (2_3)-rd subordinate link arm is rotatably coupled with a (c2_3)-rd opposite-end area of the second common link arm, wherein a (c2_7)-th one-end area of the (2_4)-th subordinate link arm is rotatably coupled with a (c2_6)-th opposite-end area of the (2_3)-nd subordinate link arm and a (c2_7)-th opposite-end area of the (2_4)-th subordinate link arm is rotatably coupled with a (c2_2)-nd opposite-end area of the (2_2)-nd transfer link arm, and wherein the second end-effector is fixed with the (c2_7)-th opposite-end area of the (2_4)-th subordinate link arm to thereby support the substrate.

As an example, in case a first direction is defined by one direction on a plane viewed from above the vacuum chamber and a second direction is defined by another direction orthogonal to the first direction, a central axis of the hollow elevating shaft of the elevating robot is located at a position spaced a predetermined distance apart from a first direction center line and is located on a second direction center line or a second direction parallel line, wherein the first direction center line is a center line in the first direction, the second direction center line is a center line in the second direction, and the second direction parallel line is parallel to the second direction center line, wherein a driving trajectory of the travel robot is an arc between a first contact point and a second contact point where a radius of rotation of the rotation driving shaft meets the first direction center line, and wherein the radius of rotation of the rotation driving shaft is defined by the rotation of the b-th opposite-end area of the travel arm around the hollow elevating shaft.

As an example, in case the transfer robot coupled with the rotation driving shaft is driven between the first contact point and the second contact point, the travel robot allows a front of the transfer robot to be directed toward one of two ends in the first direction.

As an example, in case the transfer robot is driven between the first contact point and the second contact point, the travel robot allows a rotation direction of the b-th driving motor to be same as or opposite to a rotation direction of the hollow elevating shaft of the elevating robot.

As an example, in case the transfer robot is driven between the first contact point and the second contact point, the travel robot allows a front of the transfer robot to be directed toward one of two ends in the first direction by an operation of the b-th driving motor at the first contact point or the second contact point, wherein the operation of the b-th driving motor is deactivated while the transfer robot is traveling between the first contact point and the second contact point.

As an example, the vacuum chamber has a rectangular shape where a length in the first direction is greater than a length in the second direction.

As an example, the internal wiring hole of the travel arm of the travel robot is formed by generating a horizontal through-hole penetrating from a side surface of the b-th one-end area of the travel arm to the internal slot, and wherein the side surface of the b-th one-end area corresponding to the horizontal through-hole is sealed by a b3-rd cover.

As an example, a height of the second fixed coupling shaft is set as higher than a height of the first fixed coupling shaft such that the first end-effector and the second end-effector are positioned at different heights on a same route.

As an example, the transfer arm platform of the transfer robot further includes a c1-st wiring hole connecting the c1-st upper space and the c2-nd lower space; and a c2-nd wiring hole connecting the c1-st upper space and the c3-rd lower space.

As an example, the transfer arm platform of the transfer robot includes an upper plate and a lower plate, wherein the upper plate includes the (1_1)-st blade, the (1_2)-nd blade, the (2_1)-st blade and the (2_2)-nd blade, and wherein the lower plate is coupled with the upper plate, wherein a c1-st upper coupling hole, which is a part of the c1-st coupling hole, is formed at the c-th central area of the upper plate, wherein a c2-nd upper coupling hole, which is a part of the c2-nd coupling hole, is formed at the c-th one-side area of the upper plate, and the c2-nd stopping member, through which the c2-nd vertical through-hole is formed inside the c2-nd upper coupling hole, compartmentalize the inner space of the c2-nd upper coupling hole, wherein a c3-rd upper coupling hole, which is a part of the c3-rd coupling hole, is formed at the c-th opposite-side area of the upper plate, and a c3-rd stopping member, through which the c3-rd vertical through-hole is formed inside the c3-rd upper coupling hole, compartmentalize the inner space of the c3-rd upper coupling hole, wherein a c1-st lower coupling hole, which is another part of the c1-st coupling hole, is formed at the c-th central area of the lower plate, and the c1-st stopping member, through which the c1-st vertical through-hole is formed inside the c1-st lower coupling hole, compartmentalize the inner space of the c1-st lower coupling hole, wherein a c2-nd lower coupling hole, which is another part of the c2-nd coupling hole, is formed at the c-th one-side area of the lower plate, wherein a c3-rd lower coupling hole, which is another part of the c3-rd coupling hole, is formed at the c-th opposite-side area of the lower plate.

As an example, a c1-st upper wiring slot and a c2-nd upper wiring slot are formed in a lower surface of the upper plate, wherein the c1-st upper wiring slot connects an inner space of the c1-st upper coupling hole with a lower space of the c2-nd upper coupling hole, and wherein the c2-nd upper wiring slot connects the inner space of the c1-st upper coupling hole with a lower space of the c3-rd upper coupling hole, and wherein a c1-st lower wiring slot and a c2-nd lower wiring slot are formed in an upper surface of the lower plate, wherein the c1-st lower wiring slot connects an upper space of the c1-st lower coupling hole with an inner space of the c2-nd lower coupling hole, and wherein the c2-nd lower wiring slot connects the upper space of the c1-st lower coupling hole with an inner space of the c3-rd lower coupling hole.

BRIEF DESCRIPTION OF THE DRAWINGS

The accompanying drawings used to explain example embodiments of the present disclosure are only part of example embodiments of the present disclosure and other drawings may be obtained based on the drawings by those skilled in the art of the present disclosure without inventive work.

FIG. 4A to FIG. 4D are drawings schematically illustrating a travel robot in the substrate transfer apparatus in accordance with one example embodiment of the present disclosure.

DETAILED DESCRIPTION OF THE PREFERRED EMBODIMENTS

Figure 1A:
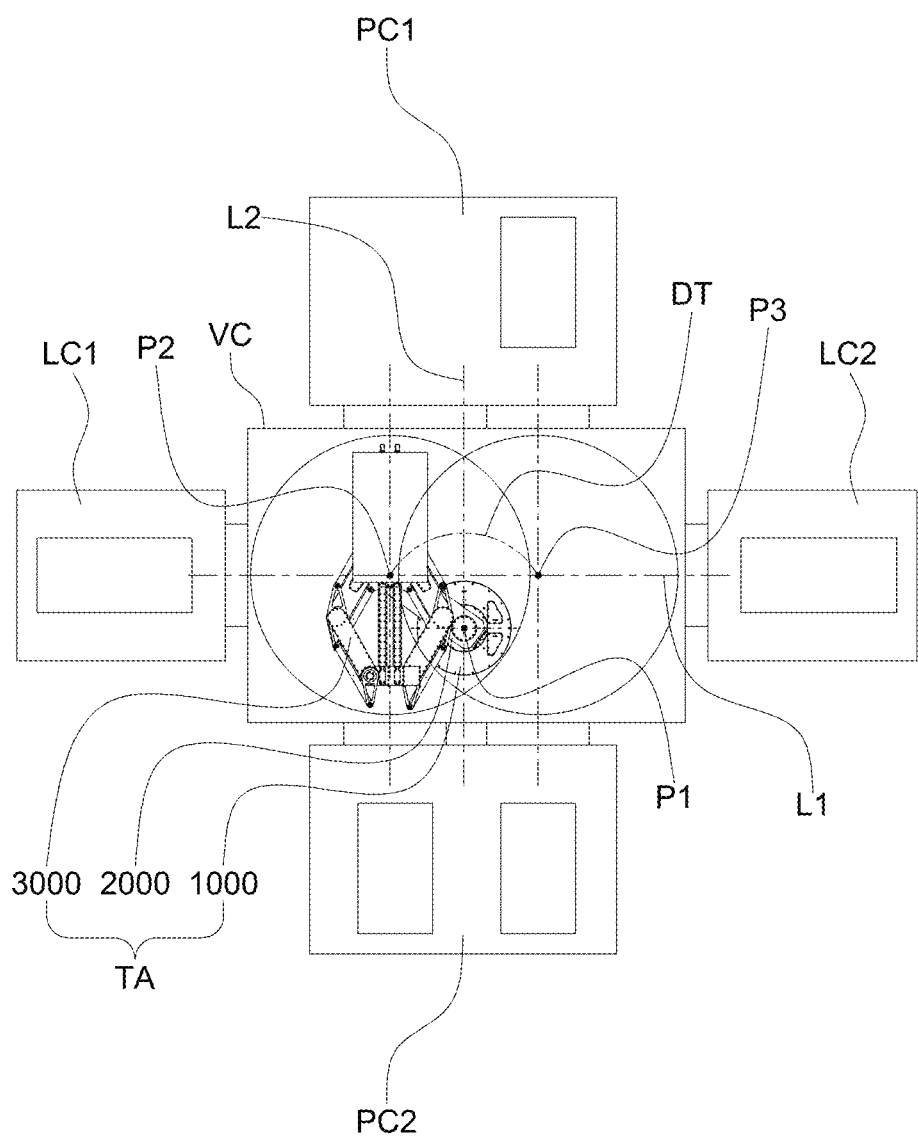
FIG. 1A to FIG. 1C are drawings illustrating a cluster-type substrate processing apparatus in which a substrate transfer apparatus is installed in accordance with one example embodiment of the present disclosure.

The following detailed description of the present disclosure refers to the accompanying drawings, which show by way of illustration a specific embodiment in which the present disclosure may be practiced, in order to clarify the objects, technical solutions and advantages of the present disclosure. These embodiments are described in sufficient detail to enable those skilled in the art to practice the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to carry out the present disclosure easily, the example embodiments of the present disclosure will be explained by referring to attached diagrams in detail as shown below.

Figure 1B:
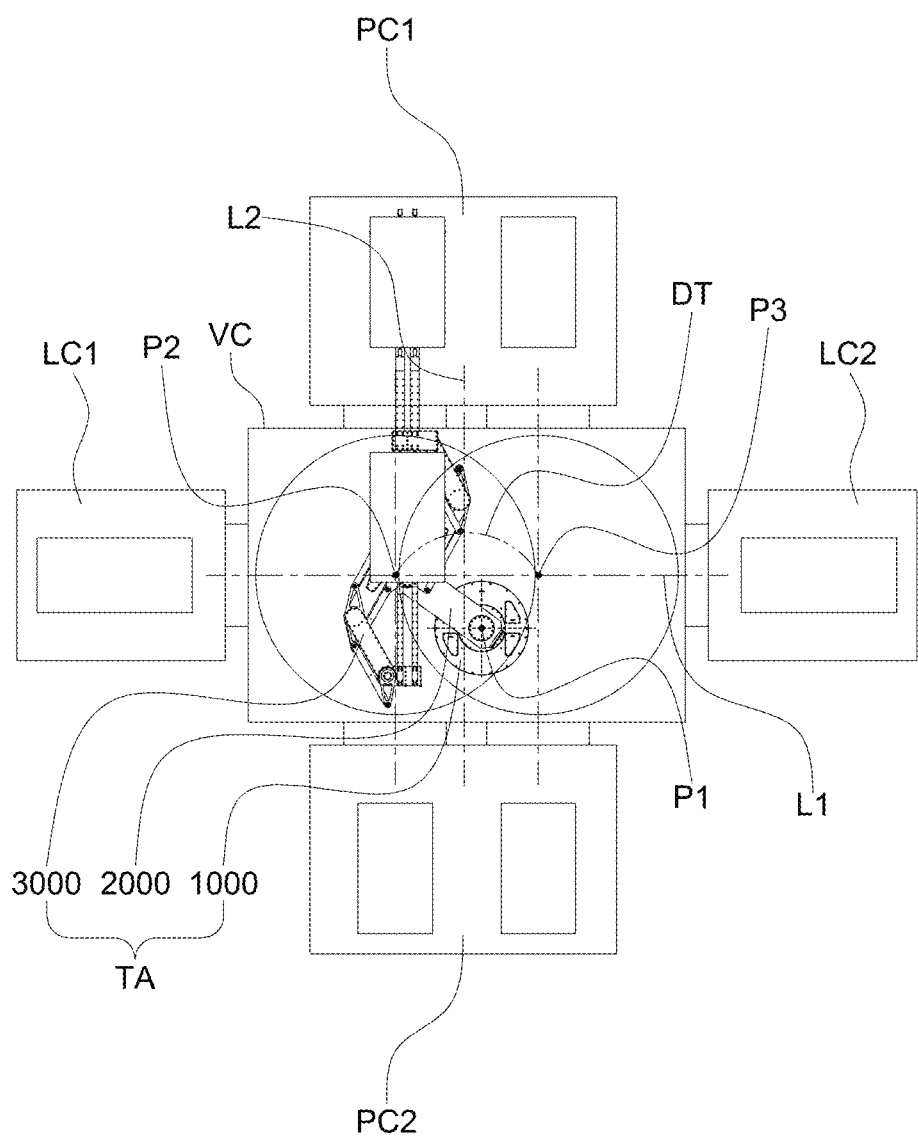
Figure 1C:
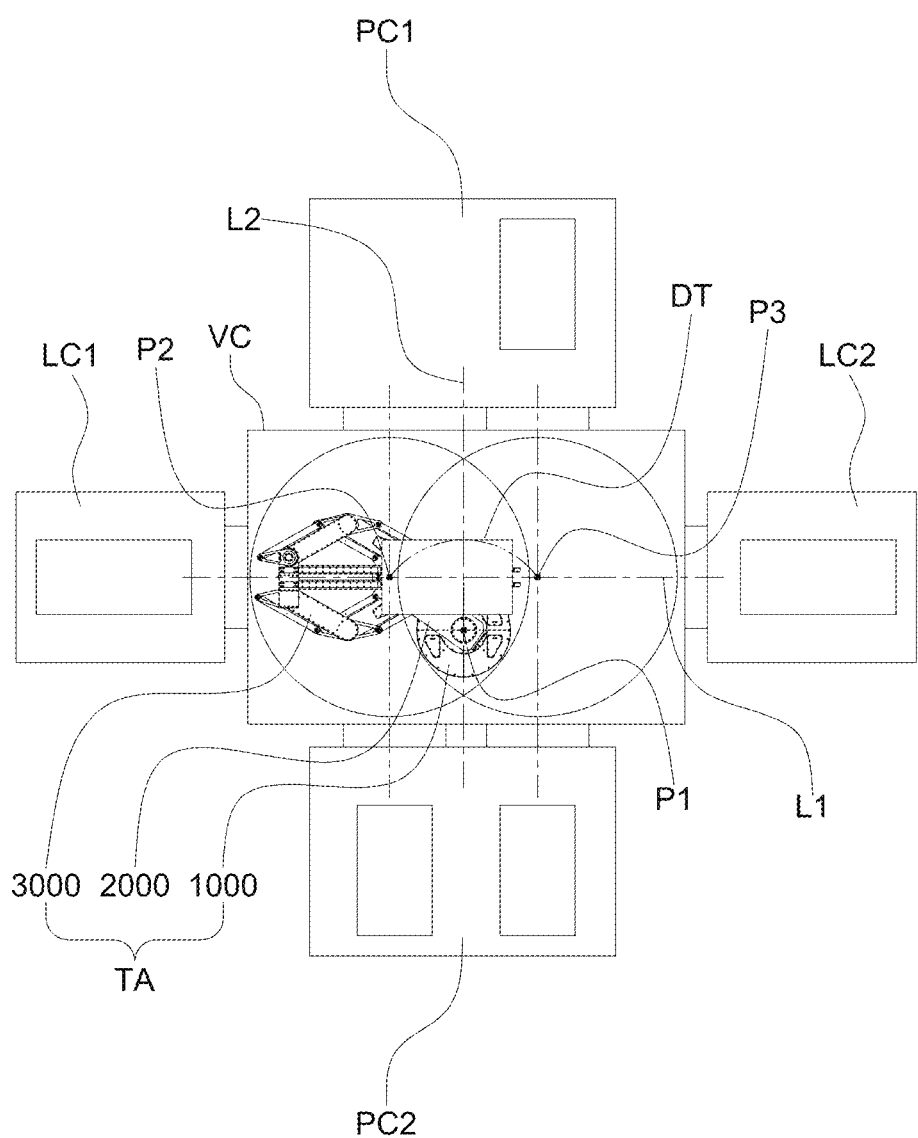

FIG. 1A to FIG. 1C are drawings illustrating a cluster-type substrate processing apparatus in which a substrate transfer apparatus is installed in accordance with one example embodiment of the present disclosure.

FIG. 1A to FIG. 1C are related to a substrate processing apparatus in which each of process chambers PC1, PC2 is installed on each side of a vacuum chamber VC, which is a transfer chamber having a tetragonal structure, and each of the process chambers can accommodate two substrates. Herein, the substrate transfer apparatus TA including an elevating robot 1000, a travel robot 2000 coupled with an upper part of the elevating robot 1000, a transfer robot 3000 coupled with an upper part of the travel robot 2000 is fixedly installed at a specific position P1 within the vacuum chamber VC. Further, the travel robot 2000 moves the transfer robot 3000 to one of positions for the two substrates in each process chamber.

As an example, in case a first direction is defined by one direction on a plane viewed from above the vacuum chamber VC and a second direction is defined by another direction orthogonal to the first direction, a center axis of the elevating robot 1000, i.e., a center axis of a hollow elevating shaft of the elevating robot 1000, is located at a position P1 spaced a predetermined distance apart from a first direction center line L1 and is located on a second direction center line L2, wherein the first direction center line L1 is a center line in the first direction, the second direction center line L2 is a center line in the second direction. However, the present disclosure is not limited thereto, and the center axis of the hollow elevating shaft may be located on a second direction parallel line which is parallel to the second direction center line L2. For reference, FIG. 1A to FIG. 1C are drawings schematically illustrating the vacuum chamber having a rectangular shape in which a length in the first direction is greater than a length in the second direction.

In addition, a driving trajectory DT of the travel robot 2000 is an arc between a first contact point P2 and a second contact point P3. Herein each contact point is where a radius of rotation of a rotation driving shaft meets the first direction center line. Further, the rotation driving shaft is located at where the transfer robot 3000 is coupled with the travel robot 2000, and the radius of rotation of the rotation driving shaft is defined by moves according to a rotation of a b-th opposite-end area of the travel arm around the hollow elevating shaft coupled with a b-th one-end area of the travel arm.

A process of transferring the substrate in the transfer vacuum chamber VC by using the substrate transfer apparatus TA which will be described below is as follows.

On condition that the transfer robot 3000 has been moved to the first contact point P2 by the travel robot 2000, the travel robot 2000 of the substrate transfer apparatus TA rotates the transfer robot 3000 in order to make a front of the transfer robot 3000, i.e., a direction in which the substrate moves away in a straight direction along which the substrate is transferred by the transfer robot 3000, be directed toward a first load lock chamber LC1 so that the transfer robot 3000 can load the substrate from the first load lock chamber LC1 into the transfer vacuum chamber VC. After loading the substrate, the travel robot 2000 of the substrate transfer apparatus TA rotates the transfer robot 3000 in order to make the front of the transfer robot 3000 be directed toward a left progress stage of the first process chamber PC1 or a left progress stage of the second process chamber PC2 which are located in the second direction, to thereby allow the transfer robot 3000 to transfer the substrate to the left progress stage of the first process chamber PC1 or the left progress stage of the second process chamber PC2.

In addition, after the transfer robot 3000 is moved to the second contact point P3 by the travel robot 2000, processes of transferring the substrate to any one of a right progress stage of the first process chamber PC1, a right progress stage of the second process chamber PC2, and the second load lock chamber LC2 after rotating the transfer robot 3000 can be easily understood through the above process, and thus a detailed description thereof will be omitted.

Meanwhile, in case the transfer robot 3000 is moved between the first contact point P2 and the second contact point P3 by the travel robot 2000, the travel robot 2000 allows the front of the transfer robot 3000 to be directed toward one of two ends in the first direction to thereby avoid a collision between the substrate and the transfer vacuum chamber VC.

Herein, a movement and a rotation of the transfer robot 3000 performed by the travel robot 2000 can be combined in various ways to minimize time of transferring the substrate.

That is, the travel robot 2000 may allow the front of the transfer robot 3000 to be directed toward one of two ends in the first direction at the first contact point P2 or the second contact point P3 and the travel robot 2000 may not rotate the transfer robot 3000 while moving the transfer robot 3000 between the first contact point P2 and the second contact point P3.

As another example, in case the travel robot 2000 moves the transfer robot 3000 between the first contact point P2 and the second contact point P3, a rotation direction of the transfer robot 3000 may be the same as or opposite to a moving direction.

As an example, in case the transfer robot 3000 is moved from the first contact point P2 to the second contact point P3 by the travel robot 2000 on condition that the front of the transfer robot 3000 is facing the second load lock chamber LC2 at the first contact point P2 as described in FIG. 1C, the transfer robot 3000 can travel from the first contact point P2 to the second contact point P3 without a rotation thereof.

As another example, in case the transfer robot 3000 is moved from the first contact point P2 to the second contact point P3 by the travel robot 2000 in order to transfer the substrate to the right progress stage of the second process chamber PC2 on condition that the front of the transfer robot 3000 is facing the first load lock chamber LC1 at the first contact point P2, the travel robot 2000 may rotate the transfer robot 3000 counterclockwise to thereby make the front of the transfer robot 3000 face the right progress stage of the second process chamber PC2 at the time of the transfer robot 3000 reaching the second contact point P3 so that the transfer robot 3000 can transfer the substrate directly from the second contact point P3 to the right progress stage of the second process chamber PC2.

As still another example, in order to transfer the substrate to the second load lock chamber LC2 on condition that the front of the transfer robot 3000 is facing the left progress stage of the first process chamber PC1, the travel robot 2000 may rotate the transfer robot 3000 clockwise while travelling from the first contact point P2 to the second contact point P3, to thereby make the front of the transfer robot 3000 face the second load lock chamber LC2 at the time of the transfer robot 3000 reaching the second contact point P3 so that the transfer robot 3000 can withdraw the substrate directly from the vacuum chamber VC to the second load lock chamber LC2 at the second contact point P3.

FIG. 1A to FIG. 1C are drawings exemplarily illustrating the substrate processing apparatus having the tetragonal structure, but the present disclosure is not limited thereto. In a state where the substrate transfer apparatus TA is fixedly installed at a specific position in a vacuum chamber having one of various structures, the travel robot can move the transfer robot along various set paths.

Figure 2A:
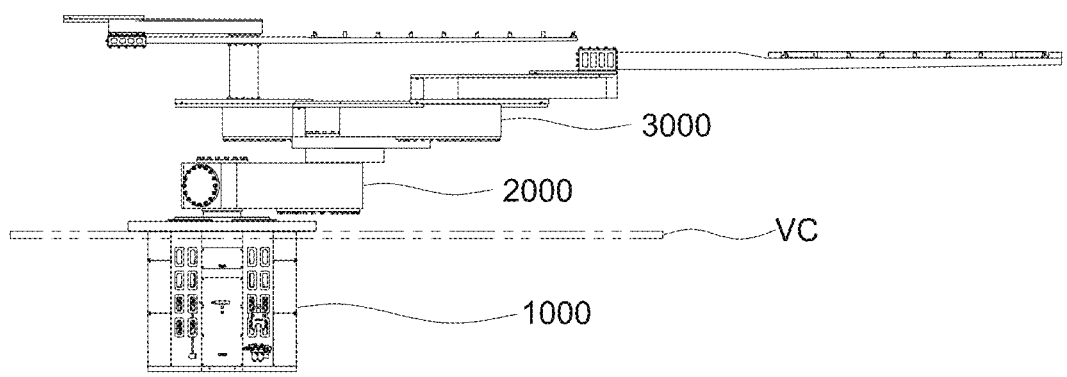
FIG. 2A and FIG. 2B are drawings schematically illustrating the substrate transfer apparatus in accordance with one example embodiment of the present disclosure.
Figure 2B:
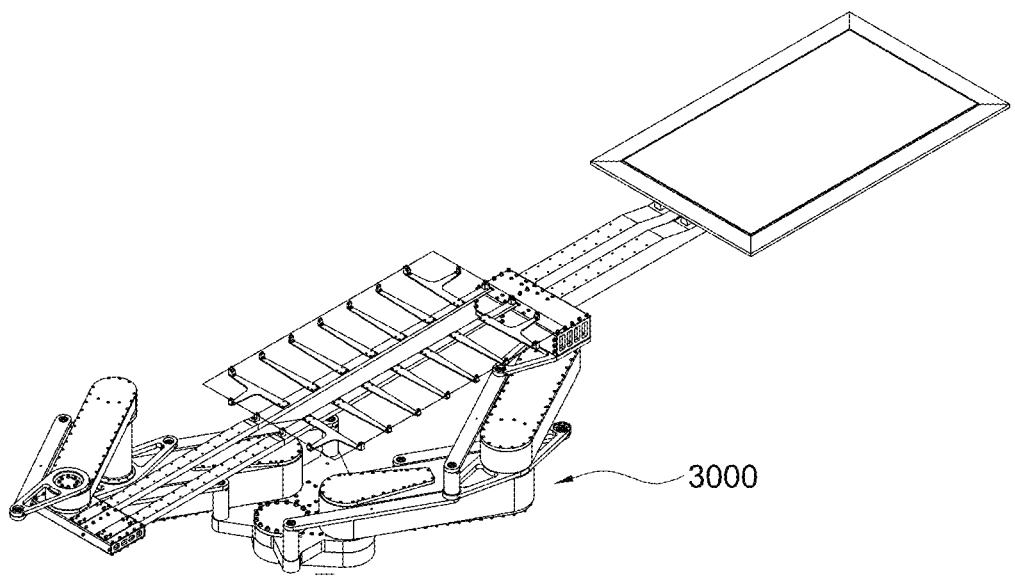
Figure 2B:
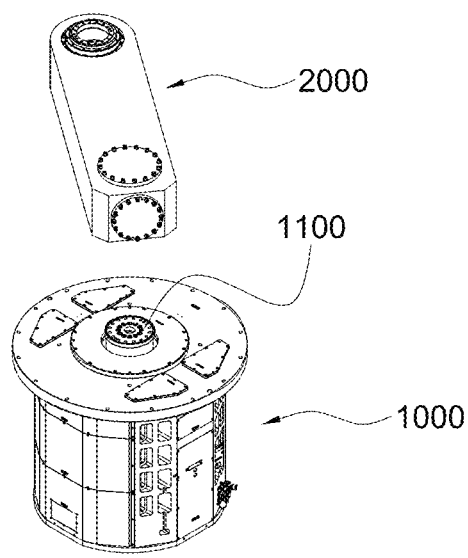

FIG. 2A and FIG. 2B are drawings schematically illustrating the substrate transfer apparatus TA in accordance with one example embodiment of the present disclosure.

By referring to FIG. 2A and FIG. 2B, the substrate transfer apparatus TA may include the elevating robot 1000, the travel robot 2000 coupled with the elevating robot 1000, and the transfer robot 3000 coupled with the travel robot 2000.

First, the elevating robot 1000 may be located in an outer lower region of a housing that seals an inner space of the vacuum chamber VC, and an upper part of the elevating robot 1000 may be sealably coupled with a vacuum chamber through-hole (not shown) which is formed in a lower region of the housing of the vacuum chamber VC. Also, the elevating robot 1000 may move up-and-down a hollow elevating shaft 1100 through which an a-th hollow hole is formed, and rotate the hollow elevating shaft 1100.

By regulating a vertical position of the transfer robot 3000 through moving up-and-down the hollow elevating shaft 1100, the elevating robot 1000 can make the transfer robot 3000 be located at a height which is appropriate for loading or unloading the substrate into or from the process chamber, etc., or allow the travel robot 2000 to drive the transfer robot 3000 through a rotation of the hollow elevating shaft 1100.

Figure 3A:
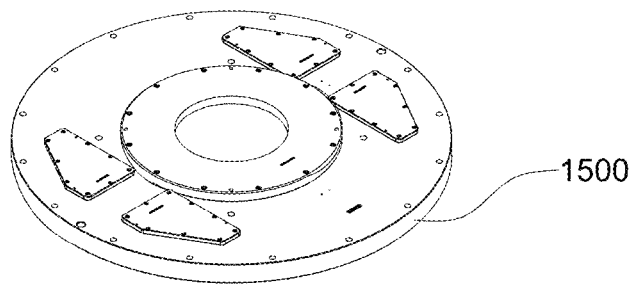
FIG. 3A to FIG. 3C are drawings schematically illustrating an elevating robot in the substrate transfer apparatus in accordance with one example embodiment of the present disclosure.
Figure 3A:
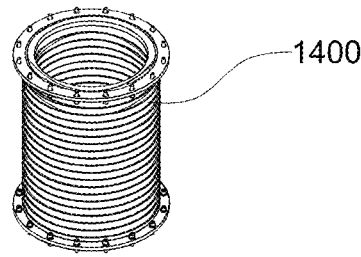
Figure 3A:
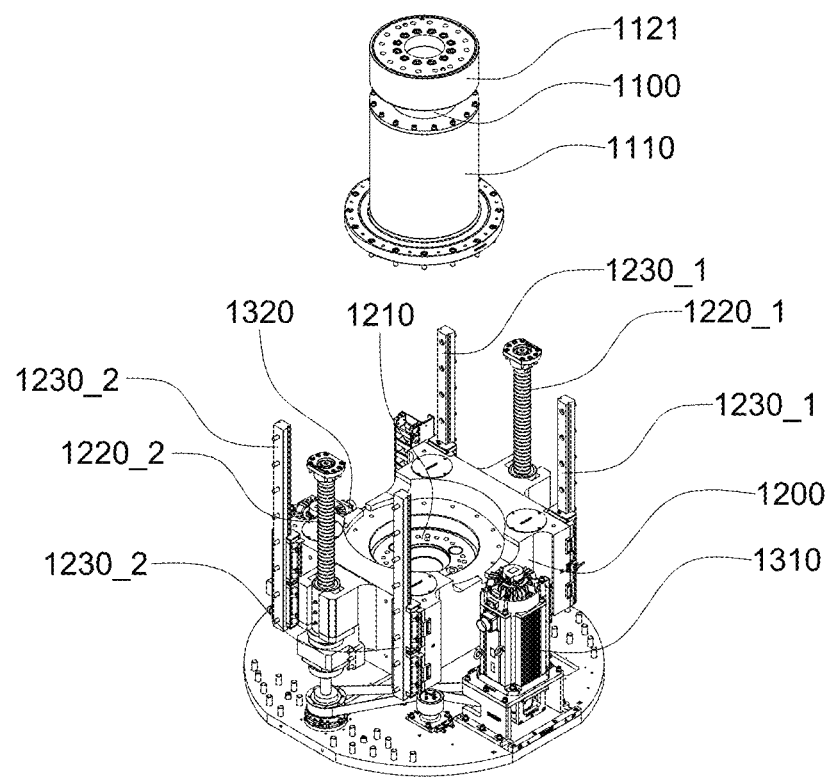
Figure 3B:
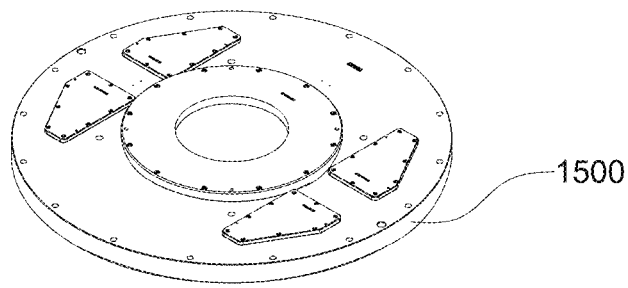
Figure 3B:
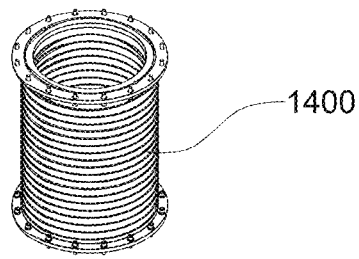
Figure 3B:
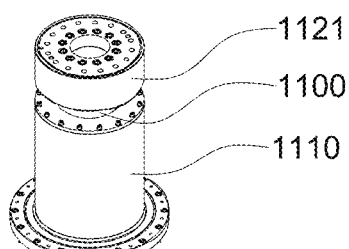
Figure 3B:
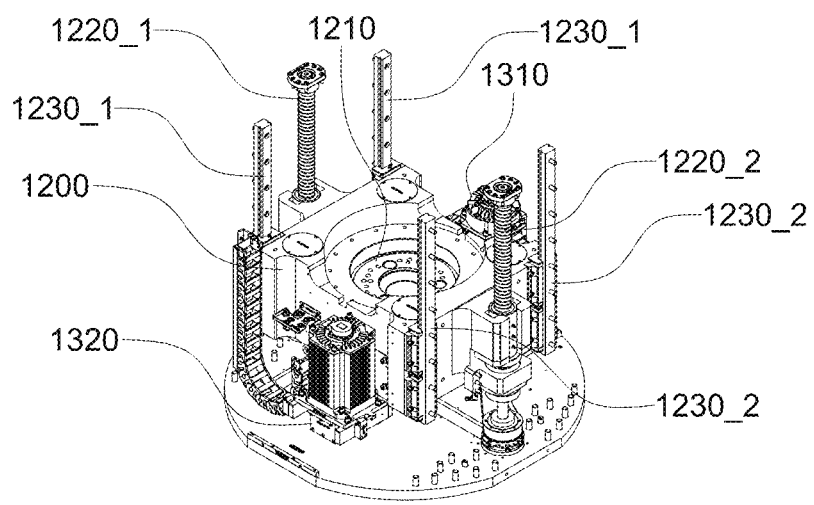
Figure 3C:
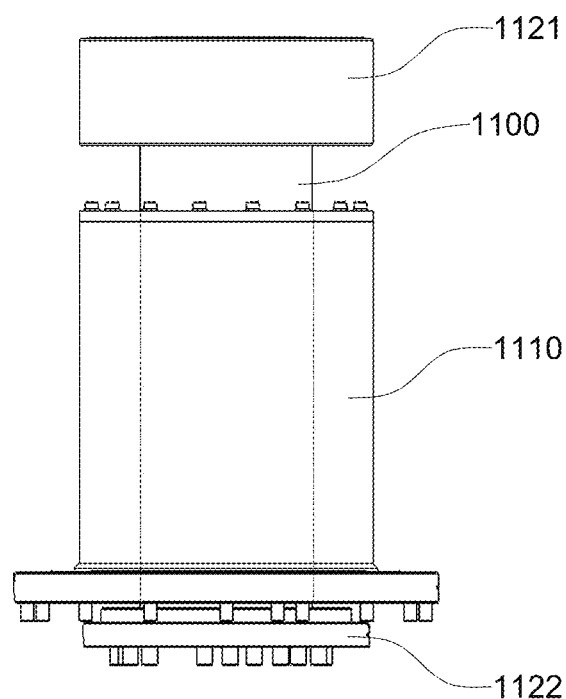
Figure 3C:
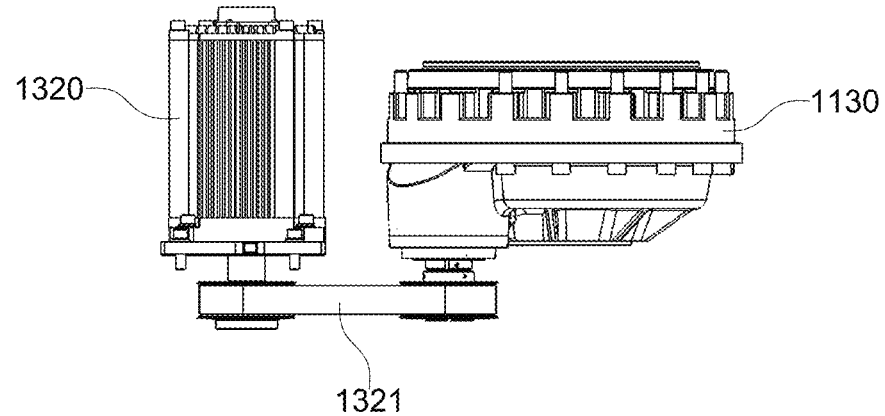
Figure 4A:
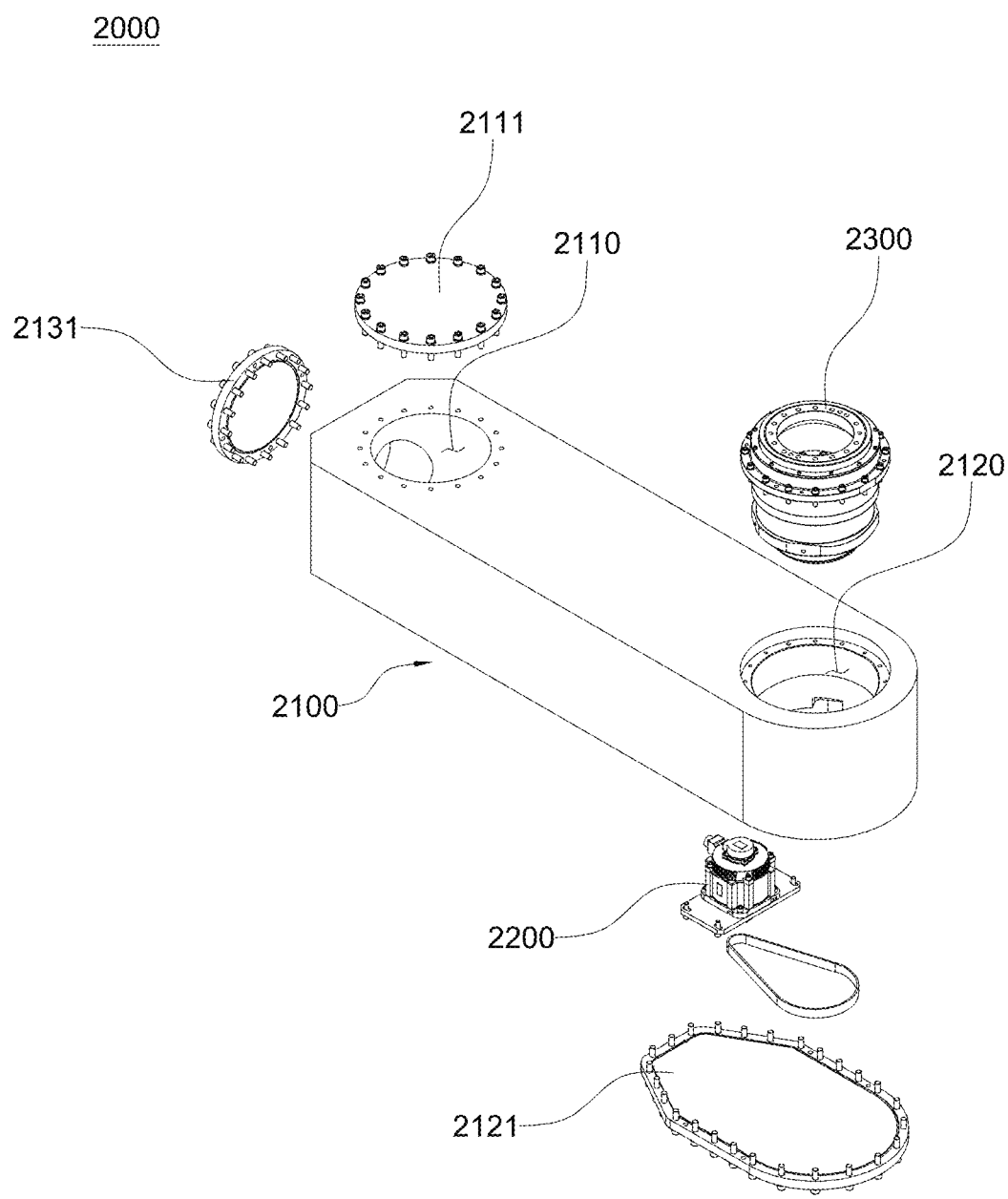
Figure 4C:
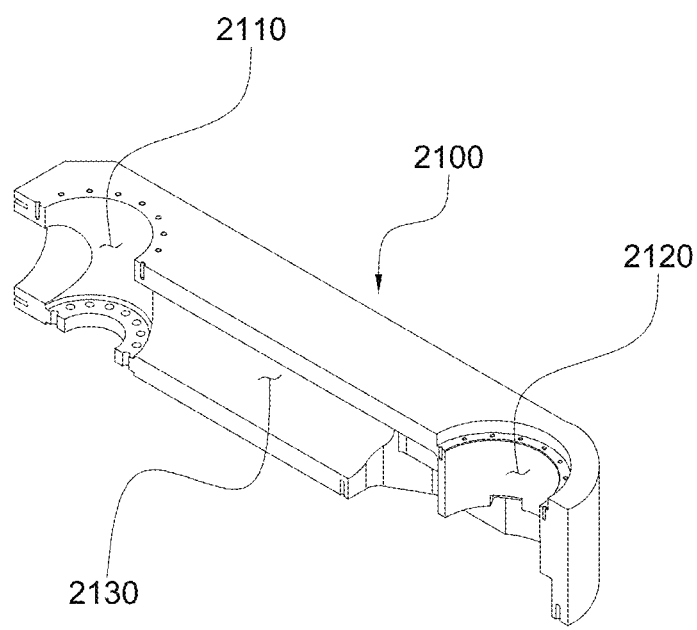
Figure 4D:
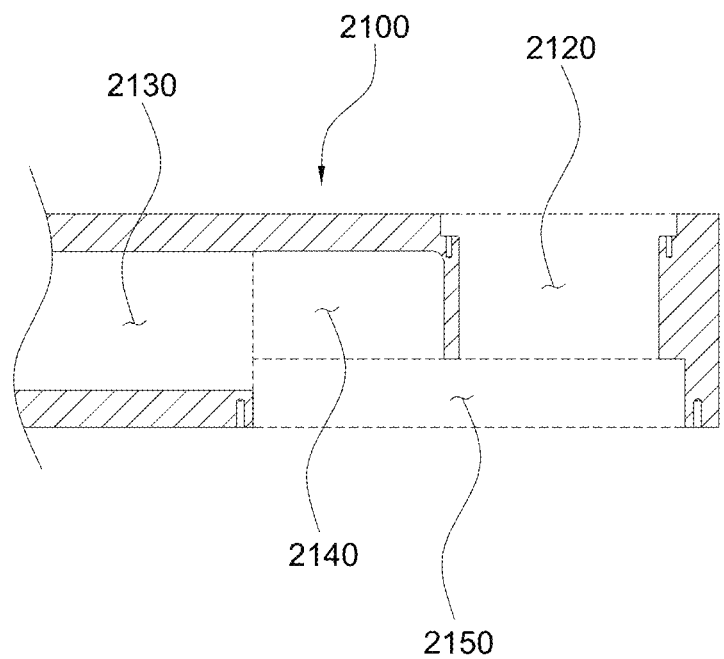

As an example, the elevating robot 1000 may be described in more detail by referring to FIG. 3A to FIG. 3C as follows.

The elevating robot 1000 may include an elevating plate 1200 formed in a lower part of the vacuum chamber and configured to move up-and-down by an elevation driving unit. An a-th vertical through-hole 1210 is formed at an a-th center area of the elevating plate 1200.

Also, the elevating robot 1000 may include the hollow elevating shaft 1100 through which an a-th hollow hole is formed, wherein the hollow elevating shaft 1100 is rotatably coupled with the a-th vertical through-hole 1210.

As an example, a hollow shaft housing 1110 is fixedly coupled with the a-th vertical through-hole 1210 in a vertical direction, and the hollow elevating shaft 1100 is rotatably installed inside the hollow shaft housing 1110. Herein, each of an upper part and a lower part of the hollow elevating shaft 1100 can be extended to an outer region of the hollow shaft housing 1110 in the vertical direction, wherein the upper part of the hollow elevating shaft 1100 is coupled with an upper flange 1121, and the lower part of the hollow elevating shaft 1100 is coupled with a lower flange 1122. However, the present disclosure is not limited thereto, and various structures in which the hollow elevating shaft 1100 can be rotatably coupled with the a-th vertical through-hole 1210 may be adopted.

Meanwhile, the elevation driving unit of the elevating robot 1000 may include a first screw shaft 1220_1 coupled with a one-side surface of the elevating plate 1200 by at least one screw nut and formed in the vertical direction, and a second screw shaft 1220_2 coupled with an opposite-side surface of the elevating plate 1200 by at least one screw nut and formed in the vertical direction. Herein, the one-side surface and the opposite-side surface of the elevating plate 1200 may be symmetrical to each other with respect to the a-th vertical through-hole 1210, but they are not limited thereto.

In addition, the elevation driving unit of the elevating robot 1000 may include an a1-st driving motor 1310 capable of providing driving force for rotating the first screw shaft 1220_1 and the second screw shaft 1220_2.

Herein, each of timing belts may be used to transmit the driving force of the a1-st driving motor 1310 to the first screw shaft 1220_1 and the second screw shaft 1220_2, and may be coupled with timing pulleys which are respectively coupled with a driving shaft of the a1-st driving motor 1310, the first screw shaft 1220_1 and the second screw shaft 1220_2. However, although it is described that transmission of the driving force between the a1-st driving motor 1310 with the first screw shaft 1220_1 and the second screw shaft 1220_2 are performed by the pulleys, the present disclosure is not limited thereto, and various methods for transmitting the driving force, such as a method using gears, may be adopted.

Accordingly, in the elevation driving unit of the elevating robot 1000, the first screw shaft 1220_1 and the second screw shaft 1220_2 may be rotated according to the operation of the a1-st driving motor 1310, and accordingly, the elevating plate 1200 is moved up-and-down in response to a rotation direction of the a1-st driving motor 1310 to thereby move the hollow elevating shaft 1100 in the vertical direction.

Also, the elevation driving unit of the elevating robot 1000 may include at least one first sliding guide 1230_1, formed on the one-side surface of the elevating plate 1200, which is configured to support a direction of the vertical movement of the elevating plate 1200; and at least one second sliding guide 1230_2, formed on the opposite-side surface of the elevating plate 1200, which is configured to support the direction of the vertical movement of the elevating plate 1200. As another example, a plurality of the sliding guides may be formed at each side surface in order to support the vertical movement of the elevating plate 1200.

In addition, the elevating plate 1200 may be fixedly coupled with an a2-nd driving motor 1320 capable of providing driving force for rotating the hollow elevating shaft 1100.

Herein, the timing belts 1321 may be used to transmit the driving force of the a2-nd driving motor 1320 to the hollow elevating shaft 1100, and may be coupled with timing pulleys, wherein the timing pulleys may be respectively coupled with a driving shaft of the a2-nd driving motor 1320 and an input shaft of an a-th speed reducer 1130. Herein, an output shaft of the a-th speed reducer 1130 may be fixedly coupled with the lower part of the hollow elevating shaft 1100, and preferably, may be fixedly coupled with the lower flange 1122 which is fixedly coupled with the lower part of the hollow elevating shaft 1100. Meanwhile, although it is described that transmission of the driving force between the a2-nd driving motor 1320 and the hollow elevating shaft 1100 is performed by the pulleys, the present disclosure is not limited thereto, and various methods for transmitting the driving force, such as a method using gears, may be adopted.

Accordingly, in the elevation driving unit of the elevating robot 1000, the hollow elevating shaft 1100 may be rotated according to the operation of the a2-nd driving motor 1320.

Also, the elevating robot 1000 may be sealably coupled with the vacuum chamber through-hole of the vacuum chamber VC by using an a-th cover 1500. Herein, the a-th cover 1500 is configured to form a through-hole into which the hollow elevating shaft 1100 may be inserted.

In addition, the elevating robot 1000 can include a bellows 1400, wherein the hollow elevating shaft 1100, preferably, the shaft housing 1110 including the hollow elevating shaft 1100 is inserted into the bellows 1400. Herein, a one-end of the bellows 1400 is coupled with a lower region of the elevating plate 1100, preferably, is coupled with a lower region of the shaft housing 1100 in which the hollow elevating shaft 1100 is installed, and an opposite-end of the bellows 1400 is coupled with the a-th cover 1500. Through this, the vacuum chamber VC may be maintained as vacuum state sealed from the outer circumstance by the bellows 1400.

Next, the travel robot 2000 in the substrate transfer apparatus may be described in more detail by referring to FIG. 4A to FIG. 4D as follows.

FIG. 4A to FIG. 4D are drawings schematically illustrating the travel robot 2000 in the substrate transfer apparatus in accordance with one example embodiment of the present disclosure. Herein, the travel robot 2000 may include a travel arm 2100, a b-th driving motor 2200, and a b-th speed reducer 2300.

At the travel arm 2100, which is configured with a single body, a b1-st vertical through-hole 2110 is formed penetrating an upper surface thereof and a lower surface thereof at a b-th one-end area thereof and a b2-nd vertical through-hole 2120 is formed penetrating the upper surface thereof and the lower surface thereof at a b-th opposite-end area thereof. Herein the lower surface faces a ground.

In addition, at the b-th opposite-end area of the travel arm 2100, an internal slot 2140 is formed at inner area of the travel arm 2100 than where the b2-nd vertical through-hole 2120 is located, wherein the internal slot 2140 is separated from the b2-nd vertical through-hole 2120 with a partition. Also, at the b-th opposite-end area of the travel arm 2100, a bottom-open-type space 2150 that connects the b2-nd vertical through-hole 2120 with the internal slot 2140 is also formed, wherein the bottom-open-type space 2150 has a predetermined depth from the lower surface toward the upper surface.

In addition, an internal wiring hole 2130 that connects the b1-st vertical through-hole 2110 of the b-th one-end area with the internal slot 2140 may be formed in the travel arm 2100.

Herein, the internal wiring hole 2130 can be formed by generating a horizontal through-hole penetrating from a side surface of the b-th one-end area of the travel arm 2100 to the internal slot 2140.

Also, the b-th driving motor 2200 may be installed in the internal slot 2140 formed at the b-th opposite-end area of the travel arm 2100, wherein the b-th driving motor 2200 is capable of providing driving force for rotating the transfer robot.

In addition, the b-th speed reducer 2300 of the travel robot 2000 may be installed in the b2-nd vertical through-hole 2120 formed at the b-th opposite-end area of the travel arm 2100, wherein the b-th speed reducer 2300 is rotated in conjunction with the b-th driving motor 2200, and wherein a rotation driving shaft thereof through which a b-th hollow hole is formed is exposed on the upper surface of the travel arm 2100.

Herein, the timing belts may be used to transmit the driving force between the b-th driving motor 2200 of the travel robot 2000 and the b-th speed reducer 2300 at the bottom-open-type space 2150, and may be coupled with timing pulleys which are respectively coupled with a driving shaft of the b-th driving motor 2200 and the lower region of the b-th speed reducer. However, the present disclosure is not limited thereto, and various methods for transmitting the driving force between the b-th driving motor 2200 and the b-th speed reducer 2300, such as a method using gears, may be adopted.

Meanwhile, the hollow elevating shaft may be sealably coupled such that the b1-st vertical through-hole 2110 is matched with the a-th hollow hole of the hollow elevating shaft of the elevating robot at a first specific lower surface area of the lower surface of the travel arm 2100 corresponding to the b1-st vertical through-hole 2110 of the b-th one-end area of the travel arm 2100, wherein a b1-st cover 2111 may be sealably coupled at a first specific upper surface area of the upper surface corresponding to the b1-st vertical through-hole of the b-th one-end area.

Also, a b2-nd cover 2121 may be sealably coupled at a second specific lower surface area of the lower surface corresponding to the bottom-open-type space 2150 of the b-th opposite-end area of the travel arm 2100.

In addition, a b3-rd cover 2131 may be sealably coupled with the horizontal through-hole at the side surface of the b-th one-end area of the travel arm 2100.

The travel robot 2000 in the substrate transfer apparatus is configured by using the travel arm 2100 comprised of the single body according to one example embodiment of the present disclosure described above, and thus a height of the travel robot 2000 itself can be minimized.

Next, the transfer robot 3000 in the substrate transfer apparatus may be described in more detail by referring to FIG. 5A to FIG. 8 as follows.

Figure 5A:
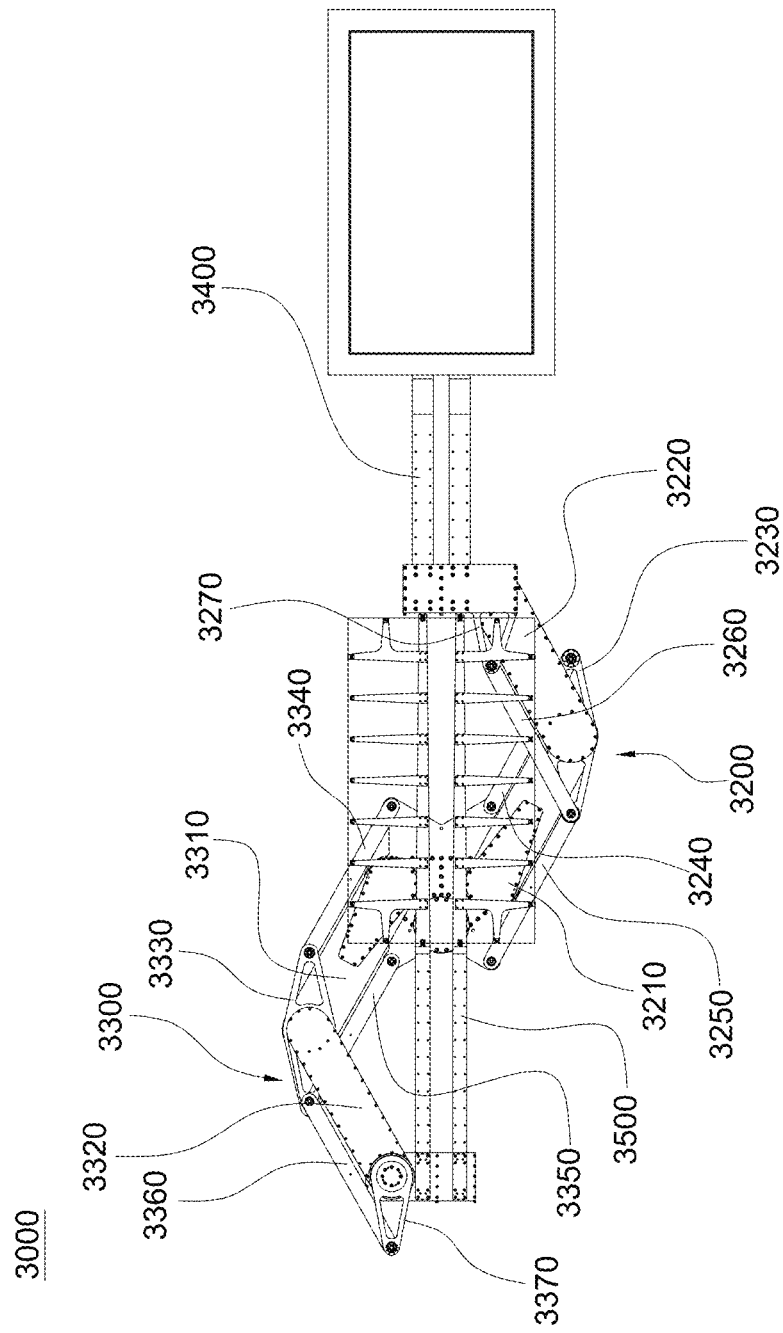
FIG. 5A and FIG. 5B are drawings schematically illustrating a transfer robot in the substrate transfer apparatus in accordance with one example embodiment of the present disclosure.
Figure 5B:
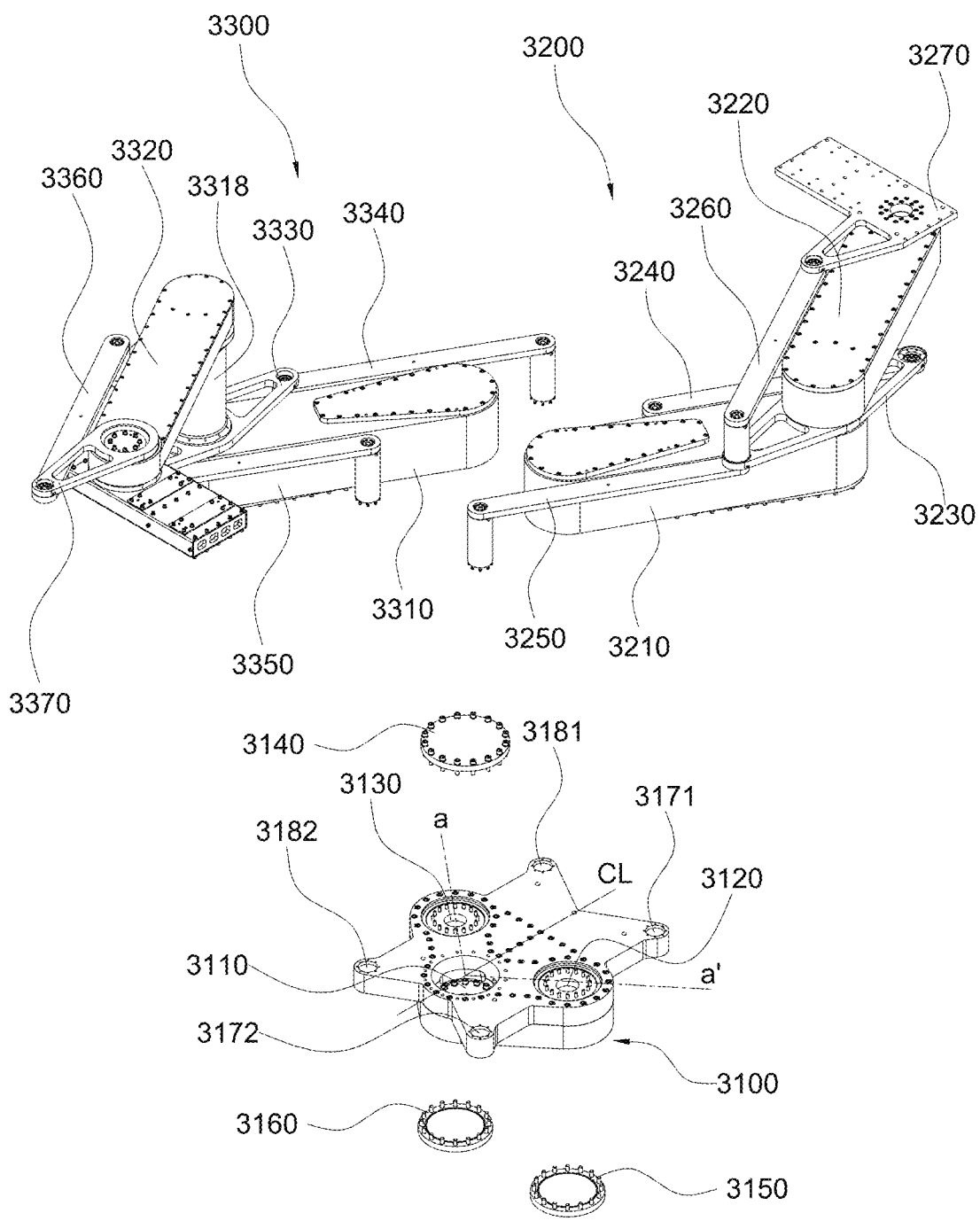

By referring to FIG. 5A and FIG. 5B, the transfer robot 3000 may include a transfer arm platform 3100 coupled with the rotation driving shaft of the b-th speed reducer of the travel robot 3000, a first transfer arm part 3200 and a second transfer arm part 3300, wherein the first transfer arm part 3200 and the second transfer arm part 3300 are coupled with the transfer arm platform 3100, and wherein each of the first transfer arm part 3200 and the second transfer arm part 3300 is coupled with each of a first end-effector 3400 and a second end-effector 3500 configured to support the substrate. For reference, FIG. 5A illustrates a state in which a mask is supported by the first end-effector 3400 and a glass substrate is supported by the second end-effector 3500, and FIG. 5B illustrates a state in which forks capable of supporting the substrates are deleted from the first end-effector 3400 and the second end-effector 3500.

Through this, the transfer robot 3000 may be moved to a particular location within the vacuum chamber by an operation of the travel robot 2000. Further, on condition that the first end-effector 3400 or the second end-effector 3500 is located at a loading position or an unloading position of the substrate by the vertical movement of the elevating robot 1000, the first end-effector 3400 or the second end-effector 3500 may load or unload the substrate according to the operations of the first transfer arm part 3200 or the second transfer arm part 3300.

Further, the transfer arm platform 3100 may include a c1-st coupling hole 3110 formed at a c-th center area which is a specific area on the center line CL, wherein the center line CL compartmentalize the transfer arm platform 3100 based on the linear movement direction of the first transfer arm part 3200 or the second transfer arm part 3300, i.e., based on the linear movement direction of the substrate moved by the transfer robot 3000; a c2-nd coupling hole 3120 formed at a c-th one-side area which is a one-side area with respect to the center line CL; and a c3-rd coupling hole 3130 formed at a c-th opposite-side area which is an opposite-side area with respect to the center line CL corresponding to the c-th one-side area.

Further, in the transfer arm platform 3100, a (1_1)-st blade 3171 and a (1_2)-nd blade 3172 for a link connection are formed respectively at a forward part and a backward part of the c2-nd coupling hole 3120, and a (2_1)-st blade 3181 and a (2_2)-nd blade 3182 for the link connection are formed respectively at a forward part and a backward part of the c3-rd coupling hole 3130.

Figure 6A:
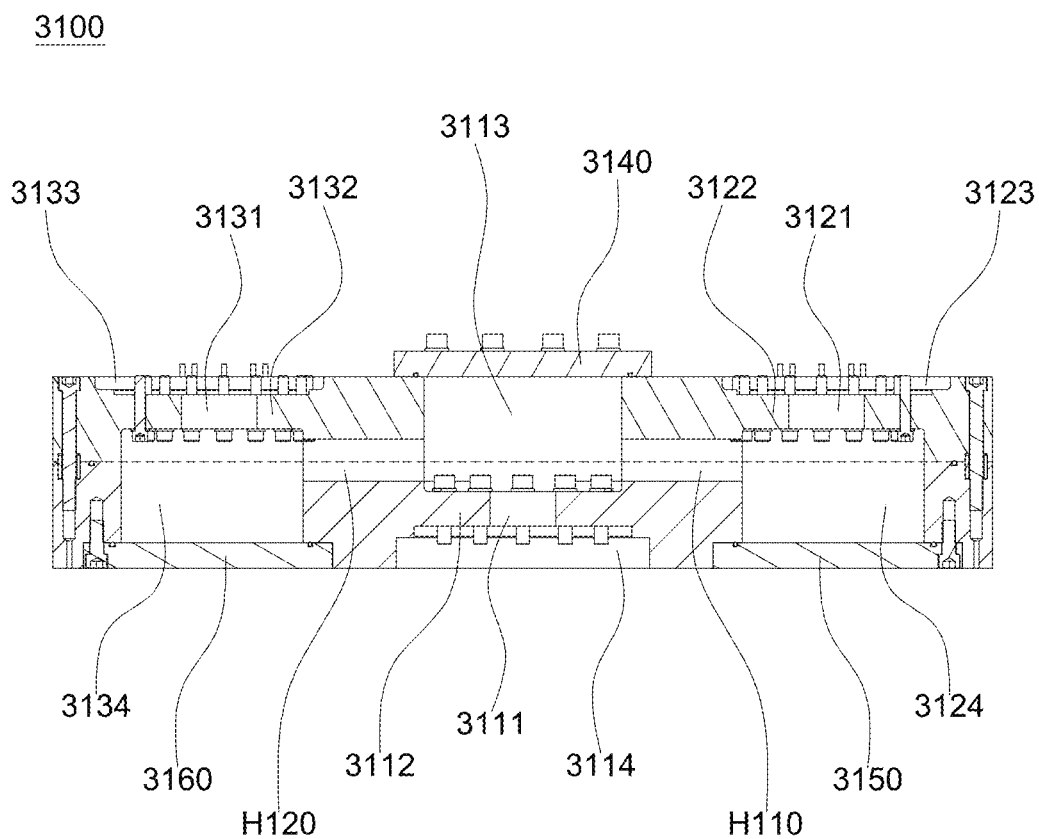
FIG. 6A to FIG. 6C are drawings schematically illustrating a transfer arm platform of the travel robot in the substrate transfer apparatus in accordance with one example embodiment of the present disclosure.

Herein, referring to FIG. 6A, a c1-st stopping member 3112, through which a c1-st vertical through-hole 3111 corresponding to the b-th hollow hole of the rotation driving shaft of the b-th speed reducer of the travel robot is formed at the c-th center area, compartmentalizes the c1-st coupling hole 3110 of the transfer arm platform 3100 into a c1-st upper space 3113 and a c1-st lower space 3114, wherein the c1-st upper space 3113 is sealed by a c1-st cover 3140.

In addition, a c2-nd stopping member 3122, through which a c2-nd vertical through-hole 3121 is formed at the c-th one-side area, compartmentalize the c2-nd coupling hole 3120 of the transfer arm platform 3100 into a c2-nd upper space 3123 and a c2-nd lower space 3124 which is sealed by a c2-nd cover 3150.

Further, a c3-rd stopping member 3132, through which a c3-rd through-hole 3131 is formed at the c-th opposite-side area, compartmentalizes the c3-rd coupling hole 3130 of the transfer arm platform 3100 into a c3-rd upper space 3133 and a c3-rd lower space 3134 which is sealed by a c3-rd cover 3160.

Also, the transfer arm platform 3100 may include a wiring hole for introducing wiring to the first transfer arm part 3200 and the second transfer arm part 3300 through the b-th hollow hole of the rotation driving shaft of the b-th speed reducer of the travel robot.

In other words, the transfer arm platform 3100 may include (i) a c1-st wiring hole H110 connecting the c1-st upper space 3113 and the c2-nd lower space 3124 and (ii) a c2-nd wiring hole H120 connecting the c1-st upper space 3113 and the c3-rd lower space 3134.

Figure 6B:
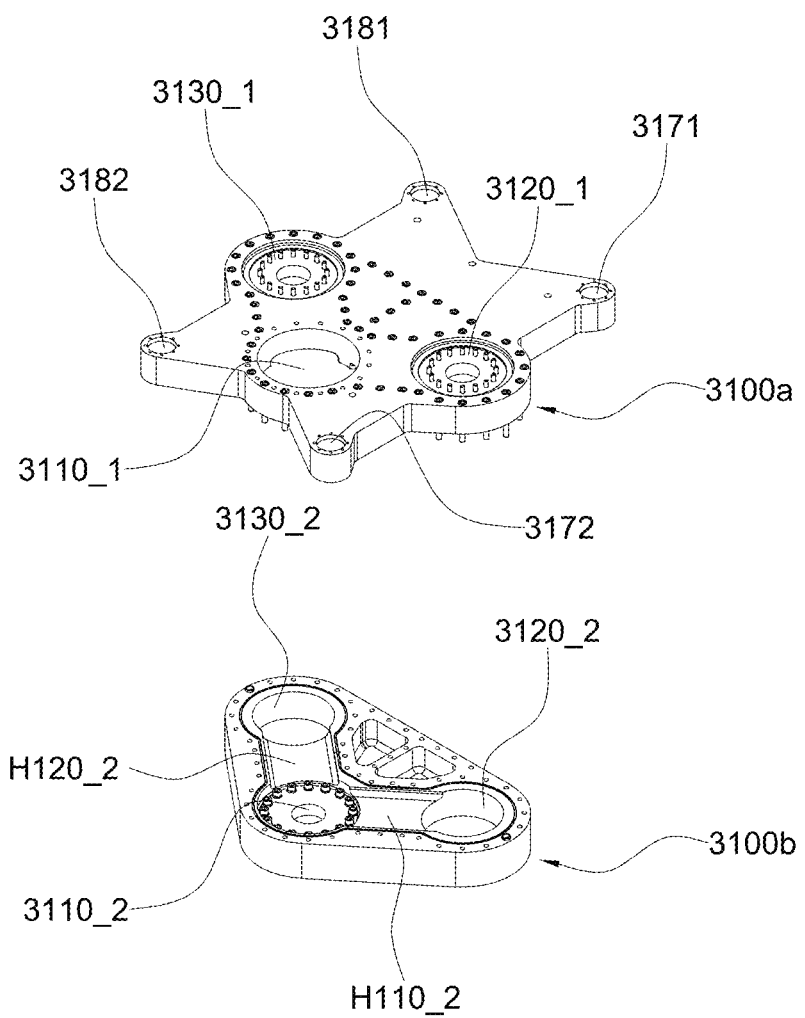
Figure 6C:
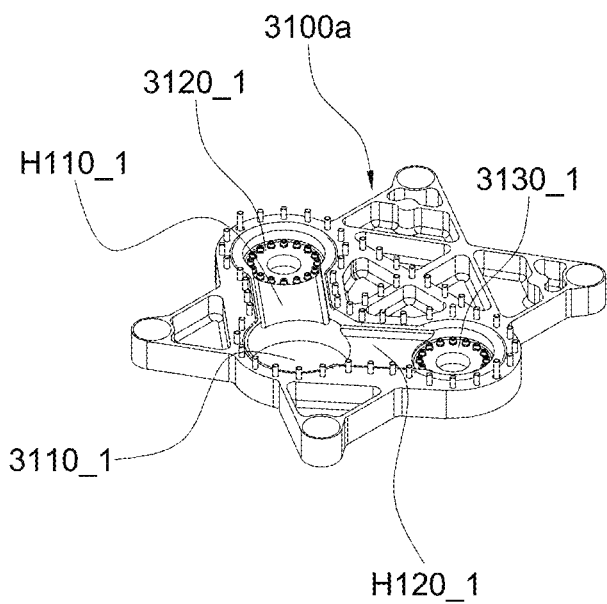

As an example, referring to FIG. 6B and FIG. 6C in addition to the FIG. 6A, the transfer arm platform 3100 may be formed by combining an upper plate 3100*a* and a lower plate 3100*b* with each other, wherein the upper plate 3100*a* includes the (1_1)-st blade 3171, the (1_2)-nd blade 3172, the (2_1)-st blade 3181 and the (2_2)-nd blade 3182.

A c1-st upper coupling hole 3110_1, which is a part of the c1-st coupling hole, is formed at the c-th central area of the upper plate 3100*a*, a c2-nd upper coupling hole 3120_1, which is a part of the c2-nd coupling hole, is formed at the c-th one-side area of the upper plate 3100*a*, and a c3-rd upper coupling hole 3130_1, which is a part of the c3-rd coupling hole, is formed at the c-th opposite-side area of the upper plate 3100*a*.

Further, a c2-nd stopping member 3122, through which the c2-nd vertical through-hole 3121 is formed inside the c2-nd upper coupling hole 3120_1, compartmentalize the inner space of the c2-nd upper coupling hole 3120_1, and a c3-rd stopping member 3132, through which the c3-rd vertical through-hole 3131 is formed inside the c3-rd upper coupling hole 3130_1, compartmentalize the inner space of the c3-rd upper coupling hole 3130_1.

Also, a c1-st upper wiring slot H110_1 and a c2-nd upper wiring slot H120_1 are formed in a lower surface of the upper plate 3100*a*, wherein the c1-st upper wiring slot H110_1 connects an inner space of the c1-st upper coupling hole 3110_1 with a lower space of the c2-nd upper coupling hole 3120_1, and the c2-nd upper wiring slot H120_1 connects the inner space of the c1-st upper coupling hole 3110_1 with a lower space of the c3-rd upper coupling hole 3130_1.

Meanwhile, a c1-st lower coupling hole 3110_2, which is another part of the c1-st coupling hole, is formed at the c-th central area of the lower plate 3100b, and a c2-nd lower coupling hole 3120_2, which is another part of the c2-nd coupling hole, is formed at the c-th one-side area of the lower plate 3100b, and a c3-rd lower coupling hole 3130_2, which is another part of the c3 coupling hole, is formed at the c-th opposite-side area of the lower plate 3100b.

Also, a c1-st stopping member 3112, through which the c1-st vertical through-hole 3111 is formed inside the c1-st lower coupling hole 3110_2, compartmentalize the inner space of the c1-st lower coupling hole 3110_2.

In addition, a c1-st lower wiring slot H110_2 and a c2-nd lower wiring slot H120_2 are formed in an upper surface of the lower plate 3100b, wherein the c1-st lower wiring slot H110_2 connects an upper space of the c1-st lower coupling hole 3110_2 with an inner space of the c2-nd lower coupling hole 3120_2, and the c2-nd lower wiring slot H120_2 connects the upper space of the c1-st lower coupling hole 3110_2 with an inner space of the c3-rd lower coupling hole 3130_2.

Thus, by coupling the upper plate 3100a and the lower plate 3100b, the c1-st upper coupling hole 3110_1 and the c1-st lower coupling hole 3110_2 are combined with each other thereby forming the c1-st coupling hole 3110, the c2-nd upper coupling hole 3120_1 and the c2-nd lower coupling hole 3120_2 are combined with each other thereby forming the c2-nd coupling hole 3120, and the c3-rd upper coupling hole 3130_1 and the c3-rd lower coupling hole 3130_2 are combined with each other thereby forming the c3-rd coupling hole 3130. Also, by coupling the upper plate 3100a and the lower plate 3100b, the c1-st upper wiring slot H110_1 and the c1-st lower wiring slot H110_2 are combined with each other thereby forming the c1-st wiring hole H110, and the c2-nd upper wiring slot H120_1 and the c2-nd lower wiring slot H120_2 are combined with each other thereby forming the c2-nd wiring hole H120.

Referring FIG. 5A and FIG. 5B again, the transfer arm platform 3100 may be coupled with the travel robot. In detail, the rotation driving shaft of the b-th speed reducer of the travel robot may be inserted into the c1-st lower space of the c1-st coupling hole 3110, thereby allowing the rotation driving shaft of the b-th speed reducer of the travel robot to be fixedly coupled with the c1-st stopping member. Herein, when the rotation driving shaft of the b-th speed reducer of the travel robot is fixedly coupled with the c1-st stopping member, a sealing performance at a coupling area may be improved by adding the sealing members such as the O-rings, the gaskets, etc. Since the configuration of adding the sealing members, such as the O-rings, the gaskets, etc., may be similarly applied to other coupling parts to be described hereinafter, a description thereon is omitted in the following description of the present disclosure.

Accordingly, exposure to an external environment through the b-th hollow hole of the rotation driving shaft of the b-th speed reducer of the travel robot may be sealed away, at the c1-st coupling hole 3110, from the vacuum environment of the inside of the vacuum chamber.

Also, the (1_1)-st transfer link arm 3210 of the first transfer arm part 3200 can be coupled with the c2-nd coupling hole 3120 of the transfer arm platform 3100, and the (2_1)-st transfer link arm 3310 of the second transfer arm part 3300 can be coupled with the c3-rd coupling hole 3130 of the transfer arm platform 3100.

Figure 7:
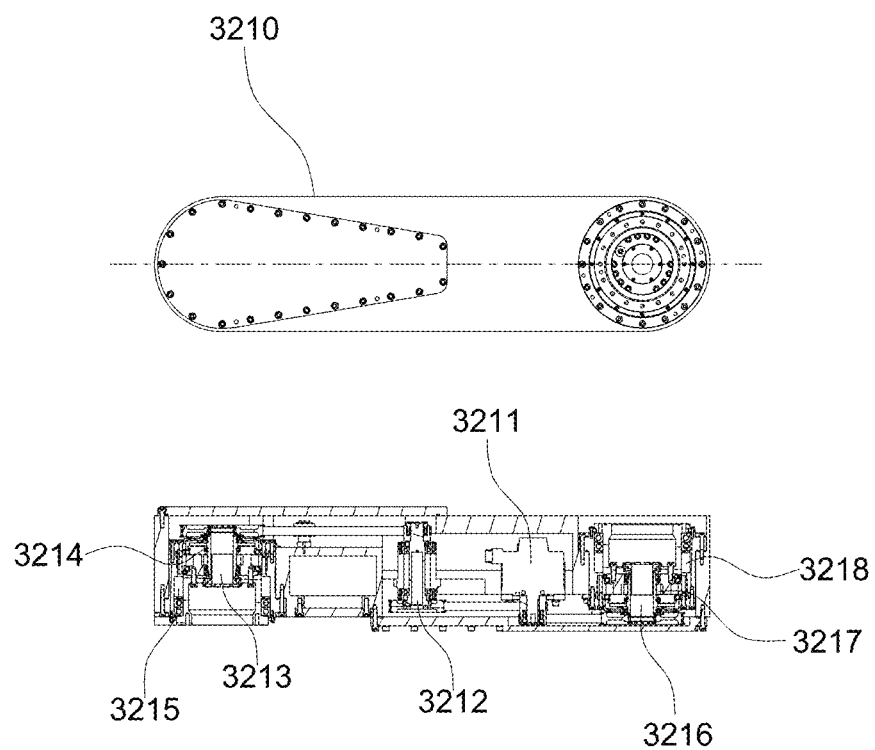
FIG. 7 is a drawing schematically illustrating a (1_1)-st travel link arm of the travel robot in the substrate transfer apparatus in accordance with one example embodiment of the present disclosure.

Herein, referring to FIG. 7, the (1_1)-st transfer link arm 3210 of the first transfer arm part 3200 has a sealed inner space where the c1-st driving motor 3211 and the c1-st speed reducer 3212 are installed, wherein the c1-st speed reducer 3212 is interlocked with the c1-st driving motor 3211 to reduce a rotational speed of the c1-st driving motor by half.

Also, a (c1_1)-st hollow driving shaft 3213 having a (c1_1)-st hollow hole interlocked with the c1-st speed reducer and a (c1_1)-st output shaft 3214 interlocked with the (c1_1)-st hollow driving shaft 3213 may be sealably installed on a (c1_1)-st one-end area of the (1_1)-st transfer link arm 3210, and a (c1_2)-nd hollow driving shaft 3216 having a (c1_2)-nd hollow hole interlocked with the c1-st driving motor 3211 and a (c1_2)-nd output shaft 3217 interlocked with the (c1_2)-nd hollow driving shaft 3216 may be sealably installed on a (c1_1)-st opposite-end area of the (1_1)-st transfer link arm 3210. Herein, the interlocking between the c1-st driving motor 3211 and the c1-st speed reducer 3212, the interlocking between the c1-st speed reducer 3212 and the (c1_1)-st hollow driving shaft 3213, and the interlocking between the c1-st driving motor 3211 and the (c1_2)-nd hollow driving shaft 3216 may be achieved by pulley method, respectively, however, the present disclosure is not limited thereto. For example, various methods, such as a method using gears, etc. may be adopted to transmit a rotational force. Also, not only the (c1_1)-st hollow driving shaft 3213 with the (c1_1)-st output shaft 3214 but also the (c1_2)-nd hollow driving shaft 3216 with the (c1_2)-nd output shaft 3217 can be formed by speed reducers each of which has a same reduction ratio. In addition, the (c1_1)-st output shaft 3214 and the (c1_2)-nd output shaft 3217 can be driven with opposite rotation directions.

Referring FIG. 5A and FIG. 5B again, the (c1_1)-st output shaft may be inserted into the c2-nd upper space of the c2-nd coupling hole 3120 of the transfer arm platform 3100 to thereby be fixedly coupled with the c2-nd stopping member. Herein, the (c1_1)-st output shaft is installed on a (c1_1)-st one-end area of the (1_1)-st transfer link arm 3210 of the first transfer arm part 3200.

Herein, a (2_1)-st linking member (corresponding to 3125 in FIG. 7) is a tube-shaped shaft and may be used for coupling the (c1_1)-st output shaft with the c2-nd stopping member, and each of the two-ends of the (2_1)-st linking member can be fixedly coupled with each of the (c1_1)-st output shaft and the c2-nd stopping member. Herein, the length of the (2_1)-st linking member is same as or larger than a distance between the (c1_1)-st output shaft and the c2-nd stopping member, specifically at the position where the transfer arm platform 3100 is coupled with the (1_1)-st transfer link arm 3210.

Also, a (c1_2)-nd output shaft of the (1_1)-st transfer link arm 3210 of the first transfer arm part 3200 may be fixedly coupled with a (c1_2)-nd one-end area of the (1_2)-nd transfer link arm 3220.

Herein, a first fixed coupling shaft (corresponding to 3128 in FIG. 7) is a tube-shaped shaft and may be used for coupling the (c1_2)-nd output shaft of the (1_1)-st transfer link arm 3210 with the (c1_2)-nd one-end area of the (1_2)-nd transfer link arm 3220, and each of the two-ends of the first fixed coupling shaft can be fixedly coupled with each of the (c1_2)-nd output shaft and the (c1_2)-nd one-end area. Herein, the length of the first fixed coupling shaft is same as or larger than a distance between the (c1_2)-nd output shaft and the (c1_2)-nd one-end area, specifically at the position where the (1_1)-st transfer link arm 3210 is coupled with the (1_2)-nd transfer link arm 3220.

Also, a first common link arm 3230 may be installed at a location where the (1_1)-st transfer link arm 3210 and the (1_2)-nd transfer link arm 3220 are coupled, in other words, at a location where the (c1_2)-nd output shaft and the (c1_2)-nd one-end area are coupled.

Figure 8:
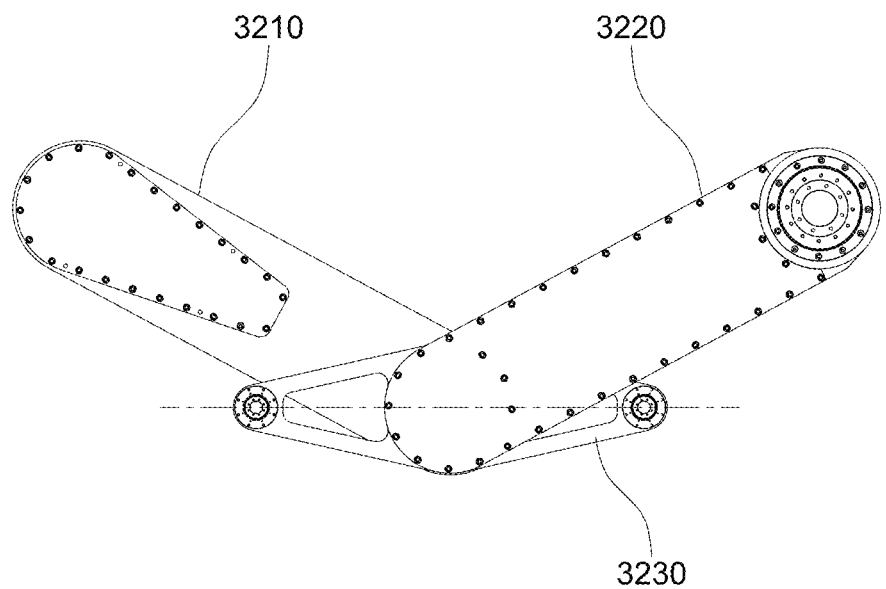
FIG. 8 is drawing schematically illustrating a connecting part between the (1_1)-st transfer link arm and a (1_2)-nd transfer link arm of the transfer robot in the substrate transfer apparatus in accordance with one example embodiment of the present disclosure.
Figure 8:
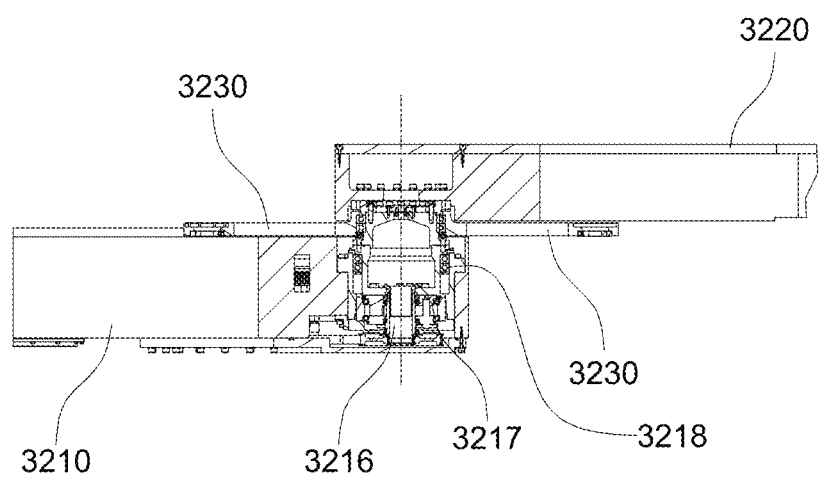

That is, by referring to FIG. 8, a c1-st center area of the first common link arm 3230 may be rotatably coupled with the first fixed coupling shaft 3218, wherein the first fixed coupling shaft 3218 combines the (c1_2)-nd output shaft 3217 with the (c1_2)-nd one-end area.

Also, by referring to FIG. 5A and FIG. 5B again, the first transfer arm part 3200 may include a (1_1)-st subordinate link arm 3240 that is parallel to the (1_1)-st transfer link arm 3210, wherein a (c1_4)-th one-end area of the (1_1)-st subordinate link arm 3240 may be rotatably coupled with the (1_1)-st blade 3171 of the transfer arm platform 3100, and a (c1_4)-th opposite-end area of the (1_1)-st subordinate link arm 3240 may be rotatably coupled with a (c1_3)-rd one-end area of the first common link arm 3230.

Additionally, the first transfer arm part 3200 may include a (1_2)-nd subordinate link arm 3250 that is parallel to the (1_1)-st transfer link arm 3210, wherein a (c1_5)-th one-end area of the (1_2)-nd subordinate link arm 3250 may be rotatably coupled with the (1_2)-nd blade 3172 of the transfer arm platform 3100, and a (c1_5)-th opposite-end area of the (1_2)-nd subordinate link arm 3250 may be rotatably coupled with a (c1_3)-rd opposite-end area of the first common link arm 3230.

Accordingly, two single parallel links may be formed as a double parallel link, wherein each of the two single parallel links shares the (1_1)-st transfer link arm 3210 with each other.

In other words, one single parallel link is formed by a frame, an input link, a connecting arm and a follower. Herein, the frame is formed by two joints, wherein one joint is where the (c1_1)-st one-end area of the (1_1)-st transfer link arm 3210 is coupled with the c2-nd coupling hole 3120 of the transfer arm platform 3100 and another joint is where the (c1_4)-th one-end area of the (1_1)-st subordinate link arm 3240 is coupled with the (1_1)-st blade 3171 of the transfer arm platform 3100. Further, the input link is formed by the (1_1)-st transfer link arm 3210. Further, the connecting arm is formed by the first common link arm between two joints, wherein one joint is where the (c1_1)-st opposite-end area of the (1_1)-st transfer link arm 3210 is coupled with the c1-st center area of the first common link arm 3230 and another joint is where the (c1_3)-rd one-end area of the first common link arm 3230 is coupled with the (c1_4)-th opposite-end area of the (1_1)-st subordinate link arm 3240. Further, the follower is formed by the (1_1)-st subordinate link arm 3240. Herein, the frame is a concept that may or may not physically exist, and is a reference line or a reference plane that fixes one-end of the input link and one-end of the follower that constitute the parallel link. Thus, the frame mentioned below should be interpreted similarly.

Also, another single parallel link is formed by a frame, an input link, a connecting arm and a follower. Herein, the frame is formed by two joints, wherein one joint is where the (c1_1)-th one-end area of the (1_1)-st transfer link arm 3210 is coupled with the c2-nd coupling hole 3120 of the transfer arm platform 3100 and another joint is where the (c1_5)-th one-end area of the (1_2)-nd subordinate link arm 3250 is coupled with the (1_2)-nd blade 3172 of the transfer arm platform 3100. Further, the input link is formed by the (1_1)-st transfer link arm 3210. Further, the connecting arm is formed by the first common link arm between two joints, wherein one joint is where the (c1_1)-st opposite-end area of the (1_1)-st transfer link arm 3210 is coupled with the c1-st center area of the first common link arm 3230 and another joint is where the (c1_3)-rd opposite-end area of the first common link arm 3230 is coupled with the (c1_5)-th opposite-end area of the (1_2)-nd subordinate link arm 3250. Further, the follower is formed by the (1_2)-nd subordinate link arm 3250.

By means of such double parallel links, vibration and/or disturbance of the first end-effector 3400 during the movement along a substrate transfer route can be reduced.

In addition, the first transfer link arm part 3200 may include a (1_3)-st subordinate link arm 3260, which is parallel to the (1_2)-nd transfer link arm 3220, wherein a (c1_6)-th one-end area of the (1_3)-rd subordinate link arm 3260 is rotatably coupled with the (c1_3)-rd opposite-end area of the first common link arm 3230. Herein, the joint where the (c1_6)-th one-end area of the (1_3)-rd subordinate link arm 3260 is coupled with the (c1_3)-rd opposite-end area of the first common link arm 3230 may be formed at the same position with the joint where the (c1_5)-th opposite-end area of the (1_2)-rd subordinate link arm 3250 is coupled with the (c1_3)-rd opposite-end area of the first common link arm 3230, or may be formed at a different position.

Also, the first transfer link arm part 3200 may include a (1_4)-st subordinate link arm 3270, which is parallel to the first common link arm 3230, wherein the (c1_7)-th one-end area of the (1_4)-th subordinate link arm 3270 is rotatably coupled with the (c1_6)-th opposite-end area of the (1_3)-rd subordinate link arm 3260, and the (c1_7)-th opposite-end area of the (1_4)-th subordinate link arm 3270 is rotatably coupled with the (c1_2)-nd opposite-end area of the (1_2)-nd transfer link arm 3220.

In addition, the first transfer link arm 3200 may include the first end-effector 3400, wherein the first end-effector 3400 is fixed to the (c1_7)-th opposite-end area of the (1_4)-th subordinate link arm 3270, thereby supporting the substrate. For reference, FIG. 5B illustrates a plate formed integrally with the (1_4)-th subordinate link arm 3270, wherein the plate is used for fixing the forks of the first end-effector 3400 capable of supporting the substrate.

The first transfer arm part 3200 configured like above allows the first end-effector 3400 to move forward or backward by using each of the transfer arms and the subordinate arms along a straight path according to an operation of the c1-st driving motor 3211, thereby allowing the substrate to be loaded or unloaded at a predetermined position through the first end-effector 3400.

Also, by referring to FIG. 5A and FIG. 5B again, the second transfer arm part 3300 may be configured similarly to the first transfer arm part 3200, and may be installed on the transfer arm platform 3100 so as to be symmetrical to the first transfer arm part 3200 with respect to the center line CL of the transfer arm platform 3100.

In other words, the (2_1)-st transfer link arm 3310 of the second transfer arm part 3300 has a sealed inner space where the c2-nd driving motor and the c2-nd speed reducer are installed, wherein the c2-nd speed reducer is interlocked with the c2-nd driving motor to reduce a rotational speed of the c2-nd driving motor by half.

Also, a (c2_1)-st hollow driving shaft having a (c2_1)-st hollow hole interlocked with the c2-nd speed reducer and a (c2_1)-st output shaft interlocked with the (c2_1)-st hollow driving shaft may be sealably installed on a (c2_1)-st one-end area of the (2_1)-st transfer link arm 3310, and a (c2_2)-nd hollow driving shaft having a (c2_2)-nd hollow hole interlocked with the c2-nd driving motor and a (c2_2)- nd output shaft interlocked with the (c2_2)-nd hollow driving shaft may be sealably installed on a (c2_1)-st opposite-end area of the (2_1)-st transfer link arm 3310. Herein, the interlocking between the c2-nd driving motor and the c2-nd speed reducer, the interlocking between the c2-nd speed reducer and the (c2_1)-st hollow driving shaft, and the interlocking between the c2-nd driving motor and the (c2_2)-nd hollow driving shaft may be achieved by pulley method, respectively, however, the present disclosure is not limited thereto. For example, various methods, such as a method of using gears, etc. may be adopted to transmit a rotational force. Also, not only the (c2_1)-st hollow driving shaft with the (c2_1)-st output shaft but also the (c2_2)-nd hollow driving shaft with the (c2_2)-nd output shaft can be formed by speed reducers each of which has a same reduction ratio. In addition, the (c2_1)-st output shaft and the (c2_2)-nd output shaft can be driven with opposite rotation directions.

Also, the (c2_1)-st output shaft may be inserted into the c3-rd upper space of the c3-rd coupling hole 3130 of the transfer arm platform 3100 to be fixedly coupled with the c3-rd stopping member. Herein, the (c2_1)-st output shaft is installed on a (c2_1)-st one-end area of the (2_1)-st transfer link arm 3310 of the second transfer arm part 3300.

Herein, a (2_2)-nd linking member is a tube-shaped shaft and may be used for coupling the (c2_1)-st output shaft with the c3-rd stopping member, and each of the two-ends of the (2_2)-nd linking member can be fixedly coupled with each of the (c2_1)-st output shaft and the c3-rd stopping member. Herein, the length of the (2_2)-nd linking member is same as or larger than a distance between the (c2_1)-st output shaft and the c3-rd stopping member, specifically at the position where the transfer arm platform 3100 is coupled with the (2_1)-st transfer link arm 3310.

Also, a (c2_2)-nd output shaft of the (2_1)-st transfer link arm 3310 of the second transfer arm part 3300 may be fixedly coupled with a (c2_2)-nd one-end area of the (2_2)-nd transfer link arm 3320.

Herein, a second fixed coupling shaft 3318 is a tube-shaped shaft and may be used for coupling the (c2_2)-nd output shaft of the (2_1)-st transfer link arm 3310 and the (c2_2)-nd one-end area of the (2_2)-nd transfer link arm 3320, and each of the two-ends of the second fixed coupling shaft 3318 can be fixedly coupled with each of the (c2_2)-nd output shaft and the (c2_2)-nd one-end area. Herein, the length of the second fixed coupling shaft 3318 is same as or larger than a distance between the (c2_2)-nd output shaft and the (c2_2)-nd one-end area, specifically at the position where the (2_1)-st transfer link arm 3310 is coupled with the (2_2)-nd transfer link arm 3320. Also, a height of the second fixed coupling shaft 3318, which connects the (2_1)-st transfer link arm 3310 with the (2_2)-nd transfer link arm 3320 of the second transfer arm part 3300, may be set as higher than a height of the first fixed coupling shaft which connects the (1_1)-st transfer link arm 3210 with the (1_2)-nd transfer link arm 3220 of the first transfer arm part 3200. Accordingly, the first end-effector 3400 of the first transfer arm part 3200 and the second end-effector 3500 of the second transfer arm part 3300 are positioned at different heights on a same transferring route. However, the present disclosure is not limited thereto. As another example, the height of the first fixed coupling shaft may be set as higher than a height of the second fixed coupling shaft.

Next, a second common link arm 3330 may be installed at a location where the (2_1)-st transfer link arm 3310 is coupled with the (2_2)-nd transfer link arm 3320, in other words, at a location where the (c2_2)-nd output shaft is coupled with the (c2_2)-nd one-end area.

That is, a c2-nd center area may be rotatably coupled with the second fixed coupling shaft, wherein the second fixed coupling shaft combines the (c2_2)-nd output shaft and the (c2_2)-nd one-end area.

In addition, the second transfer arm part 3300 may include the (2_1)-st subordinate link arm 3340 that is parallel to the (2_1)-st transfer link arm 3310, wherein a (c2_4)-th one-end area of the (2_1)-st subordinate link arm 3340 may be rotatably coupled with the (2_1)-st blade 3181 of the transfer arm platform 3100, and a (c2_4)-th opposite-end area of the (2_1)-st subordinate link arm 3340 may be rotatably coupled with a (c2_3)-rd one-end area of the second common link arm 3330.

Also, the second transfer arm part 3300 may include a (2_2)-nd subordinate link arm 3350 that is parallel to the (2_1)-nd transfer link arm 3310, wherein a (c2_5)-th one-end area of the (2_2)-nd subordinate link arm 3350 may be rotatably coupled with the (2_2)-nd blade 3182 of the transfer arm platform 3100, and a (c2_5)-th opposite-end area of the (2_2)-nd subordinate link arm 3350 may be rotatably coupled with a (c2_3)-rd opposite-end area of the second common link arm 3330.

Accordingly, two single parallel links may be formed as a double parallel link, wherein each of the two single parallel links shares the (2_1)-st transfer link arm 3310 with each other.

In other words, one single parallel link is formed by a frame, an input link, a connecting arm and a follower. Herein, the frame is formed by two joints, wherein one joint is where the (c2_1)-st one-end area of the (2_1)-st transfer link arm 3310 is coupled with the c3-rd coupling hole 3320 of the transfer arm platform 3100 and another joint is where the (c2_4)-th one-end area of the (2_1)-st subordinate link arm 3340 is coupled with the (2_1)-st blade 3181 of the transfer arm platform 3100. Further, the input link is formed by the (2_1)-st transfer link arm 3310. Further, the connecting arm is formed by the second common link arm 3330 between two joints, wherein one joint is where the (c2_1)-st opposite-end area of the (2_1)-st transfer link arm 3310 is coupled with the c2-nd center area of the second common link arm 3330 and another joint is where the (c2_3)-rd one-end area of the second common link arm 3330 is coupled with the (c2_4)-th opposite-end area of the (2_1)-st subordinate link arm 3340. Further, the follower is formed by the (2_1)-st subordinate link arm 3340.

Also, another single parallel link is formed by a frame, an input link, a connecting arm and a follower. Herein, the frame is formed by two joints, wherein one joint is where the (c2_1)-th one-end area of the (2_1)-st transfer link arm 3310 is coupled with the c3-rd coupling hole 3130 of the transfer arm platform 3100 and another joint is where the (c2_5)-th one-end area of the (2_2)-nd subordinate link arm 3350 is coupled with the (2_2)-nd blade 3182 of the transfer arm platform 3100. Further, the input link is formed by the (2_1)-st transfer link arm 3310. Further, the connecting arm is formed by the second common link arm 3330 between two joints, wherein one joint is where the (c2_1)-st opposite-end area of the (2_1)-st transfer link arm 3310 is coupled with the c2-nd center area of the second common link arm 3330 and another joint is where the (c2_3)-rd opposite-end area of the second common link arm 3330 is coupled with the (c2_5)-th opposite-end area of the (2_2)-nd subordinate link arm 3350. Further, the follower is formed by the (2_2)-nd subordinate link arm 3350.

By means of such a double parallel link, vibration and/or disturbance of the second end-effector 3500 during the movement along the transfer route can be reduced.

Also, the second transfer link arm part 3300 may include a (2_3)-rd subordinate link arm 3360, which is parallel to the (2_2)-nd transfer link arm 3320, wherein a (c2_6)-th one-end area of the (2_3)-rd subordinate link arm 3360 is rotatably coupled with the (c2_3)-rd opposite-end area of the second common link arm 3330. Herein, the joint where the (c2_6)-th one-end area of the (2_3)-rd subordinate link arm 3360 is coupled with the (c2_3)-rd opposite-end area of the second common link arm 3330 may be formed at the same position with the joint where the (c2_5)-th opposite-end area of the (2_2)-nd subordinate link arm 3350 is coupled with the (c2_3)-rd opposite-end area of the second common link arm 3330, or may be formed at a different position.

In addition, the second transfer link arm part 3300 may include a (2_4)-th subordinate link arm 3370, which is parallel to the second common link arm 3330, wherein the (c2_7)-th one-end area of the (2_4)-th subordinate link arm 3370 is rotatably coupled with the (c2_6)-th opposite-end area of the (2_3)-rd subordinate link arm 3360 and the (c2_7)-th opposite-end area of the (2_4)-th subordinate link arm 3370 is rotatably coupled with the (c2_2)-nd opposite-end area of the (2_2)-nd transfer link arm 3320.

Also, the second transfer link arm part 3300 may include the second end-effector 3500, wherein the second end-effector 3500 is fixed to the (c2_7)-th opposite-end area of the (2_4)-th subordinate link arm 3370, thereby supporting the substrate. For reference, FIG. 5B illustrates the plate formed separately with the (2_4)-th subordinate link arm 3370, wherein the plate is used for fixing the forks of the second end-effector 3500 capable of supporting the substrates. Herein, the plate for fixing the forks of the second end-effector 3500 capable of supporting the substrates is fixedly coupled with the (c2_7)-th opposite-end area of the (2_4)-th subordinate link arm 3370.

The second transfer arm part 3300 configured like above allows the second end-effector 3500 to move forward or backward by using each of the transfer arms and subordinate arms along a straight path according to an operation of the c2-nd driving motor, thereby allowing the substrate to be loaded or unloaded at a predetermined position through the second end-effector 3500.

Herein, the (c1_1)-st opposite-end area of the (1_1)-st transfer link arm 3210 of the first transfer arm part 3200 and the (c2_1)-st opposite-end area of the (2_1)-st transfer link arm 3310 of the second transfer arm part 3300 can be located in the same forward part or the backward part of the transfer arm platform 3100.

As another example, the (c1_1)-st opposite-end area of the (1_1)-st transfer link arm 3210 of the first transfer arm part 3200 can be located in the forward part of the transfer arm platform 3100 and the (c2_1)-st opposite-end area of the (2_1)-st transfer link arm 3310 of the second transfer arm part 3300 can be located in the backward part of the transfer arm platform 3100.

In addition, the c1-st wiring for the operation of the c1-st driving motor 3211 and the c2-nd wiring for the operation of the c2-nd driving motor can each be located in a sealed space inside the transfer robot 3000.

Herein, the c1-st wiring may be introduced into the c1-st driving motor 3211 through each of hollow holes of at least one of the hollow elevating shafts of the elevating robot, the rotation driving shaft of the b-th speed reducer of the travel robot, and the (c1_1)-st hollow driving shaft 3213 of the transfer robot 3000, so as to prevent the c1-st wiring from being exposed to an inner space of the vacuum chamber, and the c2-nd wiring may be introduced into the c2-nd driving motor through each of hollow holes of at least one of the hollow elevating shafts of the elevating robot, the rotation driving shaft of the b-th speed reducer of the travel robot, and the (c2_1)-st hollow driving shaft of the transfer robot 3000 so as to prevent the c2-nd wiring from being exposed to an inner space of the vacuum chamber. Meanwhile, the c1-st wiring and the c2-nd wiring may be respectively branched from the rotation driving shaft of the b-th speed reducer of the travel robot into the c1-st arm part 3200 and the c2-nd arm part 3300, through the c1-st wiring hole and the c2-nd wiring hole formed in the transfer arm platform 3100.

The present disclosure has an effect of the present disclosure to form the travel robot as a single body, and to provide a more compact substrate transfer apparatus with an improved efficiency related to an installation area and an installation height.

The present disclosure has another effect of the present disclosure to provide the substrate transfer apparatus with a simple structure capable of minimizing vibration and/or disturbance and minimizing a change in posture due to a thermal expansion.

The present disclosure has still another effect of the present disclosure to provide the substrate transfer apparatus with a vacuum-sealed structure that completely blocks a generation of particles in a vacuum chamber.

The present disclosure has still yet another effect of the present disclosure to provide the substrate transfer apparatus that can reduce a manufacturing cost and an operating cost of the whole facility related to the substrate transfer apparatus.

As seen above, the present invention has been explained by specific matters such as detailed components, limited embodiments, and drawings. They have been provided only to help more general understanding of the present invention. It, however, will be understood by those skilled in the art that various changes and modification may be made from the description without departing from the spirit and scope of the invention as defined in the following claims.

Accordingly, the thought of the present invention must not be confined to the explained embodiments, and the following patent claims as well as everything including variations equal or equivalent to the patent claims pertain to the category of the thought of the present invention.

What is claimed is:

1. A substrate transfer apparatus that transfers a substrate in a vacuum chamber, comprising:
    an elevating robot including: a hollow elevating shaft through which an a-th hollow hole is formed, and an elevation driving unit that moves the hollow elevating shaft up-and-down and rotates the hollow elevating shaft, wherein the elevating robot is sealably coupled with a vacuum chamber through-hole formed in a lower region of the vacuum chamber;
    a travel robot including: (i) a travel arm, through which a b1-st vertical through-hole is formed on an upper surface thereof and a lower surface thereof at a b-th one-end area thereof and through which a b2-nd vertical through-hole is formed on the upper surface thereof and the lower surface thereof at a b-th opposite-end area thereof, wherein the lower surface faces a ground, wherein an internal slot is formed at inner area of the travel arm than where the b2-nd vertical through-hole is located, wherein the internal slot is separated from the b2-nd vertical through-hole with a partition, wherein a bottom-open-type space that connects the b2-nd vertical through-hole with the internal slot is formed in the travel arm, wherein the bottom-open-type space has a predetermined depth from the lower surface toward the upper surface, and wherein an internal wiring hole that connects the b1-st vertical through-hole with the internal slot is formed in the travel arm, (ii) a b-th driving motor installed in the internal slot of the travel arm, and (iii) a b-th speed reducer installed in the b2-nd vertical through-hole of the travel arm, wherein the b-th speed reducer rotates in conjunction with the b-th driving motor, and wherein a rotation driving shaft thereof with a b-th hollow hole is exposed on the upper surface; wherein the hollow elevating shaft is sealably coupled such that the b1-st vertical through-hole is matched with the a-th hollow hole of the hollow elevating shaft at a first specific lower surface area of the lower surface corresponding to the b1-st vertical through-hole of the b-th one-end area, wherein a b1-st cover is sealably coupled at a first specific upper surface area of the upper surface corresponding to the b1-st vertical through-hole of the b-th one-end area, and wherein a b2-nd cover is sealably coupled at a second specific lower surface area of the lower surface corresponding to the bottom-open-type space of the b-th opposite-end area; and a substrate transfer robot including: (i) a transfer arm platform including (i-1) a c1-st coupling hole, formed at a c-th center area which is a specific area on a center line corresponding to a linear movement direction of the substrate for transfer, wherein a c1-st stopping member, through which a c1-st vertical through-hole corresponding to the b-th hollow hole of the rotation driving shaft of the b-th speed reducer of the travel robot is formed, compartmentalizes the c1-st coupling hole into a c1-st upper space and a c1-st lower space, wherein the c1-st upper space is sealed by a c1-st cover, (i-2) a c2-nd coupling hole, formed at a c-th one-side area which is a one-side area with respect to the center line, wherein a c2-nd stopping member, through which a c2-nd vertical through-hole is formed, compartmentalize the c2-nd coupling hole into a c2-nd upper space and a c2-nd lower space which is sealed by a c2-nd cover, (i-3) a c3-rd coupling hole, formed at a c-th opposite-side area corresponding to the c-th one-side area at an opposite-side area with respect to the center line, wherein a c3-rd stopping member, through which a c3-rd vertical through-hole is formed, compartmentalizes the c3-rd coupling hole into a c3-rd upper space and a c3-rd lower space which is sealed by a c3-rd cover, (i-4) a (1_1)-st blade and a (1_2)-nd blade formed respectively at a forward part and a backward part of the c2-nd coupling hole, (i-5) a (2_1)-st blade and a (2_2)-nd blade formed respectively at the forward part and the backward part of the c3-rd coupling hole; and wherein the rotation driving shaft of the b-th speed reducer of the travel robot inserted into the c1-st lower space is fixedly coupled with the c1-st stopping member; (ii) a first transfer arm part including a (1_1)-st transfer link arm, a (1_2)-nd transfer link arm, a first common link arm, a (1_1)-st subordinate link arm which is parallel to the (1_1)-st transfer link arm, a (1_2)-nd subordinate link arm which is parallel to the (1_1)-st transfer link arm, a (1_3)-rd subordinate link arm which is parallel to the (1_2)-nd transfer link arm, a (1_4)-th subordinate link arm which is parallel to the first common link arm, and a first end-effector, wherein a c1-st driving motor and a c1-st speed reducer, interlocked with the c1-st driving motor to reduce a rotational speed of the c1-st driving motor by half, are installed in a sealed inner space of the (1_1)-st transfer link arm, wherein a (c1_1)-st hollow driving shaft having a (c1_1)-st hollow hole interlocked with the c1-st speed reducer and a (c1_1)-st output shaft interlocked with the (c1_1)-st hollow driving shaft are sealably installed on a (c1_1)-st one-end area of the (1_1)-st transfer link arm, wherein a (c1_2)-nd hollow driving shaft having a (c1_2)-nd hollow hole interlocked with the c1-st driving motor and a (c1_2)-nd output shaft interlocked with the (c1_2)-nd hollow driving shaft are sealably installed on a (c1_1)-st opposite-end area of the (1_1)-st transfer link arm, wherein the (c1_1)-st output shaft of the (1_1)-st transfer link arm is fixedly coupled with a (2_1)-st linking member that is inserted into the c2-nd upper space of the transfer arm platform, wherein the (2_1)-st linking member is fixedly coupled with the c2-nd stopping member, wherein a (c1_2)-nd one-end area of the (1_2)-nd transfer link arm is fixedly coupled with the (c1-2)-nd output shaft of the (1_1)-st transfer link arm through a first fixed coupling shaft, wherein a c1-st center area of the first common link arm is rotatably coupled with the first fixed coupling shaft, wherein a (c1_4)-th one-end area of the (1_1)-st subordinate link arm is rotatably coupled with the (1_1)-st blade of the transfer arm platform and a (c1_4)-th opposite-end area of the (1_1)-st subordinate link arm is rotatably coupled with a (c1_3)-rd one-end area of the first common link arm, wherein a (c1_5)-th one-side area of the (1_2)-nd subordinate link arm is rotatably coupled with the (1_2)-nd blade of the transform arm platform and a (c1_5)-th opposite-end area of the (1_2)-nd subordinate link arm is rotatably coupled with a (c1_3)-rd opposite-end area of the first common link arm, wherein a (c1_6)-th one-end area of the (1_3)-rd subordinate link arm is rotatably coupled with a (c1_3)-rd opposite-end area of the first common link arm, wherein a (c1_7)-th one-end area of the (1_4)-th subordinate link arm is rotatably coupled with a (c1_6)-th opposite-end area of the (1_3)-nd subordinate link arm and a (c1_7)-th opposite-end area of the (1_4)-th subordinate link arm is rotatably coupled with a (c1_2)-nd opposite-end area of the (1_2)-nd transfer link arm, and wherein the first end-effector is fixed with the (c1_7)-th opposite-end area of the (1_4)-th subordinate link arm to thereby support the substrate; and (iii) a second transfer arm part including a (2_1)-st transfer link arm, a (2_2)-nd transfer link arm, a second common link arm, a (2_1)-st subordinate link arm which is parallel to the (2_1)-st transfer link arm, a (2_2)-nd subordinate link arm which is parallel to the (2_1)-st transfer link arm, a (2_3)-rd subordinate link arm parallel to the (2_2)-nd transfer link arm, a (2_4)-th subordinate link arm parallel to the second common link arm, and a second end-effector, wherein a c2-nd driving motor and a c2-nd speed reducer, interlocked with the c2-nd driving motor to reduce a rotational speed of the c2-nd driving motor by half, are installed in a sealed inner space of the (2_1)-st transfer link arm, wherein a (c2_1)-st hollow driving shaft having a (c2_1)-st hollow hole interlocked with the c2-nd speed reducer and a (c2_1)-st output shaft interlocked with the (c2_1)-st hollow driving shaft are sealably installed on a (c2_1)-st one-end area of the (2_1)-st transfer link arm, wherein a (c2_2)-nd hollow driving shaft having a (c2_2)-nd hollow hole interlocked with the c2-nd driving motor and a (c2_2)-nd output shaft interlocked with the (c2_2)-nd hollow driving shaft are sealably installed on a (c2_1)-st opposite-end area of the (2_1)-st transfer link arm, wherein the (c2_1)-st output shaft of the (2_1)-st transfer link arm is fixedly coupled with a (2_2)-nd linking member that is inserted into the c3-rd upper space of the transfer arm platform, wherein the (2_2)-nd linking member is fixedly coupled with the c3-rd stopping member, wherein a (c2_2)-nd one-end area of the (2_2)-nd transfer link arm is fixedly coupled with the (c2_2)-nd output shaft of the (2_1)-st transfer link arm through a second fixed coupling shaft, wherein a c2-nd center area of the second common link arm is rotatably coupled with the second fixed coupling shaft, wherein a (c2_4)-th one-end area of the (2_1)-st subordinate link arm is rotatably coupled with the (2_1)-st blade of the transfer arm platform and a (c2_4)-th opposite-end area of the (2_1)-st subordinate link arm is rotatably coupled with a (c2_3)-rd one-end area of the second common link arm, wherein a (c2_5)-th one-side area of the (2_2)-nd subordinate link arm is rotatably coupled with the (2_2)-nd blade of the transfer arm platform and a (c2_5)-th opposite-end area of the (2_2)-nd subordinate link arm is rotatably coupled with a (c2_3)-rd opposite-end area of the second common link arm, wherein a (c2_6)-th one-end area of the (2_3)-rd subordinate link arm is rotatably coupled with a (c2_3)-rd opposite-end area of the second common link arm, wherein a (c2_7)-th one-end area of the (2_4)-th subordinate link arm is rotatably coupled with a (c2_6)-th opposite-end area of the (2_3)-nd subordinate link arm and a (c2_7)-th opposite-end area of the (2_4)-th subordinate link arm is rotatably coupled with a (c2_2)-nd opposite-end area of the (2_2)-nd transfer link arm, and wherein the second end-effector is fixed with the (c2_7)-th opposite-end area of the (2_4)-th subordinate link arm to thereby support the substrate.

2. The substrate transfer apparatus of claim 1, wherein, in case a first direction is defined by one direction on a plane viewed from above the vacuum chamber and a second direction is defined by another direction orthogonal to the first direction, a central axis of the hollow elevating shaft of the elevating robot is located at a position spaced a predetermined distance apart from a first direction center line and is located on a second direction center line or a second direction parallel line, wherein the first direction center line is a center line in the first direction, the second direction center line is a center line in the second direction, and the second direction parallel line is parallel to the second direction center line, wherein a driving trajectory of the travel robot is an arc between a first contact point and a second contact point where a radius of rotation of the rotation driving shaft meets the first direction center line, and wherein the radius of rotation of the rotation driving shaft is defined by the rotation of the b-th opposite-end area of the travel arm around the hollow elevating shaft.

3. The substrate transfer apparatus of claim 2, wherein in case the transfer robot coupled with the rotation driving shaft is driven between the first contact point and the second contact point, the travel robot allows a front of the transfer robot to be directed toward one of two ends in the first direction.

4. The substrate transfer apparatus of claim 2, wherein in case the transfer robot is moved between the first contact point and the second contact point, the travel robot allows a rotation direction of the b-th driving motor to be same as or opposite to a rotation direction of the hollow elevating shaft of the elevating robot.

5. The substrate transfer apparatus of claim 2, wherein in case the transfer robot is moved between the first contact point and the second contact point, the travel robot allows a front of the transfer robot to be directed toward one of two ends in the first direction by an operation of the b-th driving motor at the first contact point or the second contact point, wherein the operation of the b-th driving motor is deactivated while the transfer robot is traveling between the first contact point and the second contact point.

6. The substrate transfer apparatus of claim 2, wherein the vacuum chamber has a rectangular shape where a length in the first direction is greater than a length in the second direction.

7. The substrate transfer apparatus of claim 1, wherein the internal wiring hole of the travel arm of the travel robot is formed by generating a horizontal through-hole penetrating from a side surface of the b-th one-end area of the travel arm to the internal slot, and wherein the side surface of the b-th one-end area corresponding to the horizontal through-hole is sealed by a b3-rd cover.

8. The substrate transfer apparatus of claim 1, wherein a height of the second fixed coupling shaft is set as higher than a height of the first fixed coupling shaft such that the first end-effector and the second end-effector are positioned at different heights on a same route.

9. The substrate transfer apparatus of claim 1, wherein the transfer arm platform of the transfer robot further includes a c1-st wiring hole connecting the c1-st upper space and the c2-nd lower space; and a c2-nd wiring hole connecting the c1-st upper space and the c3-rd lower space.

10. The substrate transfer apparatus of claim 1, wherein the transfer arm platform of the transfer robot includes an upper plate and a lower plate, wherein the upper plate includes the (1_1)-st blade, the (1_2)-nd blade, the (2_1)-st blade and the (2_2)-nd blade, and wherein the lower plate is coupled with the upper plate, wherein a c1-st upper coupling hole, which is a part of the c1-st coupling hole, is formed at the c-th central area of the upper plate, wherein a c2-nd upper coupling hole, which is a part of the c2-nd coupling hole, is formed at the c-th one-side area of the upper plate, and the c2-nd stopping member, through which the c2-nd vertical through-hole is formed inside the c2-nd upper coupling hole, compartmentalize the inner space of the c2-nd upper coupling hole, wherein a c3-rd upper coupling hole, which is a part of the c3-rd coupling hole, is formed at the c-th opposite-side area of the upper plate, and a c3-rd stopping member, through which the c3-rd vertical through-hole is formed inside the c3-rd upper coupling hole, compartmentalize the inner space of the c3-rd upper coupling hole, wherein a c1-st lower coupling hole, which is another part of the c1-st coupling hole, is formed at the c-th central area of the lower plate, and the c1-st stopping member, through which the c1-st vertical through-hole is formed inside the c1-st lower coupling hole, compartmentalize the inner space of the c1-st lower coupling hole, wherein a c2-nd lower coupling hole, which is another part of the c2-nd coupling hole, is formed at the c-th one-side area of the lower plate, wherein a c3-rd lower coupling hole, which is another part of the c3-rd coupling hole, is formed at the c-th opposite-side area of the lower plate.

11. The substrate transfer apparatus of claim 10,
wherein a c1-st upper wiring slot and a c2-nd upper wiring slot are formed in a lower surface of the upper plate, wherein the c1-st upper wiring slot connects an inner space of the c1-st upper coupling hole with a lower space of the c2-nd upper coupling hole, and wherein the c2-nd upper wiring slot connects the inner space of the c1-st upper coupling hole with a lower space of the c3-rd upper coupling hole, and
wherein a c1-st lower wiring slot and a c2-nd lower wiring slot are formed in an upper surface of the lower plate, wherein the c1-st lower wiring slot connects an upper space of the c1-st lower coupling hole with an inner space of the c2-nd lower coupling hole, and wherein the c2-nd lower wiring slot connects the upper space of the c1-st lower coupling hole with an inner space of the c3-rd lower coupling hole.

* * * * *